United States Patent [19]
Moschytz

[11] Patent Number: 5,963,112
[45] Date of Patent: *Oct. 5, 1999

[54] CASCADED HIGHER ORDER FILTER WITH LOW SENSITIVITY TO COMPONENT VALUES AND A METHOD FOR DESIGNING THE SAME

[75] Inventor: George S. Moschytz, Zurich, Switzerland

[73] Assignee: Globespan Technologies, Inc., Red Bank, N.J.

[ * ] Notice: This patent is subject to a terminal disclaimer.

[21] Appl. No.: 08/874,863

[22] Filed: Jun. 13, 1997

Related U.S. Application Data

[60] Provisional application No. 60/032,809, Dec. 11, 1996.
[51] Int. Cl.$^6$ ....................................................... H03H 1/02
[52] U.S. Cl. ............................ 333/172; 327/552; 327/558
[58] Field of Search ............................ 333/172; 327/552, 327/558

[56] References Cited

PUBLICATIONS

Moschytz, "A Universal LOW–Q Active–Filter Building Block Suitable for Hybrid–Integrated Circuit Implementation," IEEE Transactions on Circuit Theory, vol. CT–20, No. 1, pp. 37–47, Jan. 1973.

Moschytz et al., Active Filter Design Handbook, Wiley & Sons, pp. 169–170, 1981.

*Primary Examiner*—Robert Pascal
*Assistant Examiner*—Justin P. Bettendorf
*Attorney, Agent, or Firm*—Thomas, Kayden Horstemeyer & Risley

[57] ABSTRACT

The present invention provides a higher order filter with low sensitivity to component values and to a method of designing the same. The higher order filter is constructed of second and/or third order filter circuits which have been desensitized with respect to component values and gain by impedance tapering the filter circuits. The filter circuits are impedance tapered by successively scaling the resistors and/or capacitors from left to right to minimize loading on the first filter section and to maximize the quality factor of the passive pole. The impedance of the filter sections is increased from left to right by increasing the resistor values and/or by decreasing the capacitor values from left to right. Once the lower order filter circuits have been designed, they are cascaded to provide a higher order filter with low sensitivity to component values and gain.

19 Claims, 30 Drawing Sheets

| $x$ | $-\dfrac{a_1}{a_0}\dfrac{1}{RC}S_x^{a_1}$ | | |
|---|---|---|---|
| | GENERAL IMPEDANCE SCALING | SEPARATE IMPEDANCE TAPERING | IDEAL IMPEDANCE TAPERING |
| | $r_i,\ \rho_i$<br>$i=2,3$ | $r_i=r^{i-1};\ \rho_i=\rho^{i-1}$<br>$i=2,3$ | $r_i=\rho_i=\rho^{i-1}$<br>$i=2,3$ |
| $R_1$ | $\dfrac{r_2}{\rho_2}\left[1+\dfrac{\rho_2}{\rho_3}\left(1+\dfrac{r_3}{r_2}\right)-\beta\right]$ | $\dfrac{r}{\rho}\left[1-\beta+-(1+r)\right]$ | $2-\beta+\dfrac{1}{\rho}$ |
| $R_2$ | $1+\dfrac{1}{\rho_2}(1-\beta)+\dfrac{1}{\rho_3}(1+r_3)$ | $1+\dfrac{1}{\rho}(1-\beta)+\dfrac{1}{\rho^2}(1+r^2)$ | $2+\dfrac{1}{\rho}(1-\beta)+\dfrac{1}{\rho^2}$ |
| $R_3$ | $1+(1+r_2)\left[\dfrac{1}{\rho_2}(1-\beta)+\dfrac{1}{\rho_3}\right]$ | $1+(1+r)\left[\dfrac{1-\beta}{\rho}+\dfrac{1}{\rho^2}\right]$ | $(2-\beta)\left[1+\dfrac{1}{\rho}\right]+\dfrac{1}{\rho^2}$ |
| $C_1$ | $(1+r_2)\left[\dfrac{1}{\rho_2}(1-\beta)+\dfrac{1}{\rho_3}\right]+\dfrac{r_3}{\rho_3}$ | $\dfrac{1+r}{\rho}\left(1-\beta+\dfrac{1}{\rho}\right)+\dfrac{r^2}{\rho^2}$ | $\left(1+\dfrac{1}{\rho}\right)\left(1+\dfrac{1}{\rho}-\beta\right)+1$ |
| $C_2$ | $1+\dfrac{1}{\rho_3}(1+r_2+r_3)$ | $1+\dfrac{1}{\rho^2}(1+r+r^2)$ | $2+\dfrac{1}{\rho}+\dfrac{1}{\rho^2}$ |
| $C_3$ | $\left(\dfrac{1+r_2}{\rho_2}\right)(1-\beta)+1$ | $\dfrac{1+r}{\rho}(1-\beta)+1$ | $\left(1+\dfrac{1}{\rho}\right)(1-\beta)+1$ |
| $\beta$ | $\dfrac{\beta}{\rho_2}(1+r_2)$ | $\beta\left(\dfrac{1+r}{\rho}\right)$ | $\beta\left(1+\dfrac{1}{\rho}\right)$ |

FIG.24

| | $-\frac{a_2}{a_0}\frac{1}{R^2C^2}S_x^{a_2}$ | | |
|---|---|---|---|
| X | GENERAL IMPEDANCE SCALING | SEPARATE IMPEDANCE TAPERING | IDEAL IMPEDANCE TAPERING |
| | $r_i, \rho_i$ $i=2,3$ | $r_i = r^{i-1};\ \rho_i = \rho^{i-1}$ $i=2,3$ | $r_i = \rho_i = \rho^{i-1}$ $i=2,3$ |
| $R_1$ | $\dfrac{r_2 r_3}{\rho_2 \rho_3}$ | $\dfrac{r^3}{\rho^3}$ | 1 |
| $R_2$ | $\dfrac{r_3}{\rho_3}\left(1+\dfrac{1}{\rho_2}\right)$ | $\dfrac{r^2}{\rho^2}\left(1+\dfrac{1}{\rho}\right)$ | $1+\dfrac{1}{\rho}$ |
| $R_3$ | $r_2\left[\dfrac{1}{\rho_2}(1-\beta)+\dfrac{1}{\rho_3}\right]$ | $\dfrac{r}{\rho}\left(1+\dfrac{1}{\rho}-\beta\right)$ | $1+\dfrac{1}{\rho}-\beta$ |
| $C_1$ | $\dfrac{r_3}{\rho_2 \rho_3}(1+r_2)$ | $\dfrac{r^2}{\rho^3}(1+r)$ | $1+\dfrac{1}{\rho}$ |
| $C_2$ | $\dfrac{1}{\rho_3}(r_2+r_3)$ | $\dfrac{r}{\rho^2}(1+r)$ | $1+\dfrac{1}{\rho}$ |
| $C_3$ | $\dfrac{r_2}{\rho_2}(1-\beta)$ | $\dfrac{r}{\rho}(1-\beta)$ | $1-\beta$ |
| $\beta$ | $\beta\dfrac{r_2}{\rho_2}$ | $\beta\dfrac{r}{\rho}$ | $\beta$ |

FIG.25

| n | $a_0$ | $a_1$ | $a_2$ | $a_3$ | $a_4$ | $a_5$ |
|---|---|---|---|---|---|---|
| 2 | $\omega_p^2$ | $\dfrac{\omega_p}{q_p}$ | | | | |
| 3 | $\gamma\omega_p^2$ | $\omega_p^2 + \dfrac{\gamma\omega_p}{q_p}$ | $\dfrac{\omega_p}{q_p}+\gamma$ | | | |
| 4 | $\omega_{p1}^2\omega_{p2}^2$ | $\dfrac{\omega_{p1}\omega_{p2}^2}{q_{p1}}+\dfrac{\omega_{p2}^2\omega_{p1}^2}{q_{p2}}$ | $\omega_{p1}^2+\omega_{p2}^2+\dfrac{\omega_{p1}\omega_{p2}}{q_{p1}q_{p2}}$ | $\dfrac{\omega_{p1}}{q_{p1}}+\dfrac{\omega_{p2}}{q_{p2}}$ | | |
| 5 | $\gamma\omega_{p1}^2\omega_{p2}^2$ | $\omega_{p1}^2\omega_{p2}^2+\dfrac{\gamma\omega_{p1}\omega_{p2}^2}{q_{p1}}+\dfrac{\gamma\omega_{p2}\omega_{p1}^2}{q_{p2}}$ | $\gamma\omega_{p1}^2+\gamma\omega_{p2}^2+\dfrac{\omega_{p1}\omega_{p2}}{q_{p1}q_{p2}}+\dfrac{\omega_{p1}\omega_{p2}^2}{q_{p2}}+\dfrac{\omega_{p2}\omega_{p1}^2}{q_{p1}}$ | $\omega_{p1}^2+\omega_{p2}^2+\dfrac{\omega_{p1}\omega_{p2}}{q_{p1}q_{p2}}+\gamma\dfrac{\omega_{p1}}{q_{p1}}+\gamma\dfrac{\omega_{p2}}{q_{p2}}$ | $\dfrac{\omega_{p1}}{q_{p1}}+\dfrac{\omega_{p2}}{q_{p2}}+\gamma$ | |
| 6 | $\omega_{p1}^2\omega_{p2}^2\omega_{p3}^2$ | $\dfrac{\omega_{p1}^2\omega_{p2}^2\omega_{p3}^3}{q_{p1}}+\dfrac{\omega_{p1}^2\omega_{p2}^2\omega_{p3}^3}{q_{p2}}+\dfrac{\omega_{p1}^2\omega_{p2}^2\omega_{p3}^3}{q_{p3}}$ | $\left(\omega_{p1}^2+\omega_{p2}^2+\dfrac{\omega_{p1}\omega_{p2}}{q_{p1}q_{p2}}\right)\omega_{p3}^2+\dfrac{\omega_{p3}}{q_{p3}}\dfrac{\omega_{p1}\omega_{p2}^2}{q_{p1}}+\dfrac{\omega_{p2}\omega_{p1}^2}{q_{p2}}+\omega_{p1}^2\omega_{p2}^2$ | $\dfrac{\omega_{p1}\omega_{p2}^2}{q_{p1}}+\dfrac{\omega_{p2}\omega_{p1}^2}{q_{p2}}+\left(\omega_{p1}^2+\omega_{p2}^2+\dfrac{\omega_{p1}\omega_{p2}}{q_{p1}q_{p2}}\right)\dfrac{\omega_{p3}}{q_{p3}}+\left(\dfrac{\omega_{p1}}{q_{p1}}+\dfrac{\omega_{p2}}{q_{p2}}\right)\omega_{p3}^2$ | $\omega_{p1}^2+\omega_{p2}^2+\omega_{p3}^2+\left(\dfrac{\omega_{p1}}{q_{p1}}+\dfrac{\omega_{p2}}{q_{p2}}\right)\dfrac{\omega_{p3}}{q_{p3}}$ | $\dfrac{\omega_{p1}}{q_{p1}}+\dfrac{\omega_{p2}}{q_{p2}}+\dfrac{\omega_{p3}}{q_{p3}}$ |

FIG. 26

| FILTER | $R_1$ [k$\Omega$] | $C_1$ [pf] | $\omega_0$ $10^5$ | $p_2$ | $p_3$ | $r_2$ | $r_3$ | $\beta$ |
|---|---|---|---|---|---|---|---|---|
| CHEBYSHEV $\rho_C=1$ | 39.8 | 100 | 2.51 | 1 | 1 | 1.48 | 0.143 | 2.0 |
| $\rho_C=3$ | 5.8 | 900 | 1.91636 | 3 | 9 | 0.93 | 2.72 | 2.0 |
| $\rho_C=5$ | 1.8 | 2500 | 2.1798 | 5 | 25 | 1.656 | 10.4 | 2.0 |
| BUTTERWORTH $\rho_C=1$ | 29.1 | 100 | 4.566 | 1 | 1 | 0.936 | 0.279 | 2.0 |
| $\rho_C=3$ | 3.0 | 900 | 3.704 | 3 | 9 | 0.9 | 4.0 | 2.0 |
| $\rho_C=5$ | 0.91 | 2500 | 4.396 | 5 | 25 | 1.76 | 16.7 | 2.0 |

FIG.27

| FILTER | $R_1$ [k$\Omega$] | $C_1$ [pf] | $\omega_0$ $\cdot 10^5$ | $p_2$ | $p_3$ | $r_2$ | $r_3$ | $\beta$ |
|---|---|---|---|---|---|---|---|---|
| CHEBYSHEV | | | | | | | | |
| r=1 | 10 | 280 | 7.154 | 1 | 1 | 4 | 2 | 4 |
| r=3 | 10 | 213 | 4.695 | 3 | 9 | 10.56 | 8.99 | 4 |
| r=5 | 10 | 190 | 5.263 | 5 | 25 | 16.1 | 19.3 | 4 |
| BUTTERWORTH | | | | | | | | |
| r=1 | 10 | 304 | 3.289 | 1 | 1 | 4.16 | 2.24 | 4 |
| r=3 | 10 | 235 | 4.255 | 3 | 9 | 11.14 | 10.4 | 4 |
| r=5 | 10 | 213 | 4.695 | 5 | 25 | 17.18 | 23.2 | 4 |

FIG.28

| FILTER NUMBER | $\omega_0 \cdot 10^5$ | $C_1$ [pf] | $R_1$ [k$\Omega$] | $\rho_2$ | $\rho_3$ | $r_2$ | $r_3$ | $r_3/r_2$ | $\beta$ |
|---|---|---|---|---|---|---|---|---|---|
| ① | 1 | 900 | 11.11 | 3 | 9 | 0.256 | 1.4 | 5.47 | 3.0 |
| ② | 1.25 | 900 | 8.88 | 3 | 9 | 0.382 | 1.84 | 4.81 | 2.71 |
| ③ | 1.5 | 900 | 7.4 | 3 | 9 | 0.544 | 2.24 | 4.12 | 2.43 |
| ④ | 1.75 | 900 | 6.35 | 3 | 9 | 0.754 | 2.56 | 3.4 | 2.17 |
| ⑤ | 2.0 | 900 | 5.6 | 3 | 9 | 1.04 | 2.77 | 2.66 | 1.92 |
| ⑥ | 2.25 | 900 | 4.94 | 3 | 9 | 1.455 | 2.82 | 1.94 | 1.69 |
| ⑦ | 2.5 | 900 | 4.44 | 3 | 9 | 2.15 | 2.62 | 1.22 | 1.48 |
| ⑧ | 2.6 | 900 | 4.27 | 3 | 9 | 2.594 | 2.44 | 0.94 | 1.41 |
| ⑨ | 2.75 | 900 | 4.04 | 3 | 9 | 3.806 | 1.97 | 0.52 | 1.35 |
| ⑩ | 2.9 | 900 | 3.83 | 3 | 9 | 8.58 | 1.03 | 0.12 | 1.27 |

FIG.29

CASCADED HIGHER ORDER FILTER WITH LOW SENSITIVITY TO COMPONENT VALUES AND A METHOD FOR DESIGNING THE SAME

CROSS REFERENCE TO RELATED APPLICATION

This application claims priority to and the benefit of the filing data of copending provisional application entitled A CASCADED HIGHER ORDER FILTER WITH LOW SENSITIVITY TO COMPONENT VALUES AND A METHOD FOR DESIGNING THE SAME, assigned Ser. No. 60/032,809, filed Dec. 11, 1996 (Attorney Docket Number 60704-8030). The above-referenced provisional application is incorporated herein by reference.

FIELD OF THE INVENTION

The present invention relates to a higher order filter with low sensitivity to component value variations and to a method for designing such filters. More particularly, the present invention relates to a cascaded higher order filter which has been desensitized with respect to component values by cascading impedance-tapered second and/or third order filters to increase the impedance of the filter from left to right, thereby maximizing the quality factor of the passive pole.

BACKGROUND OF THE INVENTION

It is known to minimize the sensitivity of filter characteristics to values of the gain elements of a filter by minimizing the gain-sensitivity product (GSP) of the filter. For example, "Active Filter Design Handbook", by G. S. Moschytz and P. Horn, 1981, discloses using a computer program to design biquad active filters with a low GSP. The computer program presents flow-chart listings to the designer and allows the designer to enter the specifications for the filter in terms of pole and zero frequencies and quality factors. In response to the data input by the designer, the computer program causes the minimum gain-sensitivity product (GSP) to be output. However, since the resistor values must be selected so as to minimize the GSP, this method results in only partial impedance tapering, namely, impedance tapering with respect to the capacitors of the circuit. Therefore, this method only minimizes the sensitivity of the filter characteristics to values of the gain elements.

Accordingly, a need exists for a method of designing higher order cascaded filters which minimizes the sensitivity of the filter characteristics with respect to component values and gain, thus providing a greater degree of freedom to the filter designer in selecting the components used to construct the filter.

SUMMARY OF THE INVENTION

The present invention provides a method for designing higher order (greater than third order) cascaded filters with low sensitivity to components, including gain elements, by cascading second and/or third order impedance-scaled filters to minimize loading on previous sections of the filter and to maximize the pole quality factor of the passive section of the filter. In accordance with the present invention, the sensitivity of a second order filter to component values and gain is minimized by scaling the impedance of the second filter section of the filter circuit upwards with respect to of the first section so as to minimize the loading on the first filter section. By impedance scaling the filter circuit in this manner, the pole quality factor of the first filter section is maximized. For third-order filters, the sensitivity of the filter with respect to the component values and gain is minimized by impedance scaling the filter sections from left to right in a manner similar to that for the second order filter to minimize loading on the first filter section and to increase the pole quality factor thereof. In accordance with the preferred embodiment of the present invention, filters of higher order than three having low sensitivity to component values and gain are constructed by cascading impedance-tapered second and/or third-order filters which have been impedance tapered in accordance with the method of the present invention.

The method of the present invention is particularly advantageous in designing higher order filters because impedance tapering reduces the number of amplifiers needed in designing the filters which in turn reduces the overall power consumption of the filter.

Accordingly, it is an object of the present invention to provide a cascaded higher order filter with minimum sensitivity to component values.

It is another object of the present invention to provide a filter which can be designed and manufactured in a relatively short period of time due to greater freedom in selecting the circuit components.

It is another object of the present invention to provide a method for designing discrete component active RC filters which have low sensitivity to component value variations.

It is yet another object of the present invention to provide a filter with relatively wide-tolerance components which does not require tuning.

It is yet another object of the present invention to provide a filter with low sensitivity to component values which can be comprised of discrete components or, alternatively, which can be manufactured as an integrated circuit.

It is yet another object of the present invention to provide a filter which can be constructed of discrete components and which is particularly well suited for use with digital signal processors.

It is yet another object of the present invention to provide a filter which can be constructed at relatively low cost.

It is yet another object of the present invention to provide a filter which has low power consumption.

These and other objects of the present invention will become apparent from the following description, drawings and claims.

BRIEF DESCRIPTION OF THE DRAWINGS

FIGS. 24 and 25 are tables of equations which express the coefficient sensitivities of of a1 and $a_2$, respectively, to component variations for third order lowpass filters.

FIG. 26 is a table of equations which express the relationship between $a_i$ and $\omega_{pi}$, $q_{pi}$ and $\gamma$ for allpole functions of order n=2 to 6.

FIG. 27 is a table of design values and parameters for the third order filter having the amplitude responses shown in FIG. 14.

FIG. 28 is a table listing the design values and parameters for resistance-tapered third order filters having the loss specifications shown in FIGS. 17 and 18.

FIG. 29 is a table containing values which indicate the dependence of the design parameters $r_2$, $r_3$, $r_3/r_2$ and $\beta$ on the selection of $\omega_0$.

DETAILED DESCRIPTION OF THE INVENTION

Figure 1A:
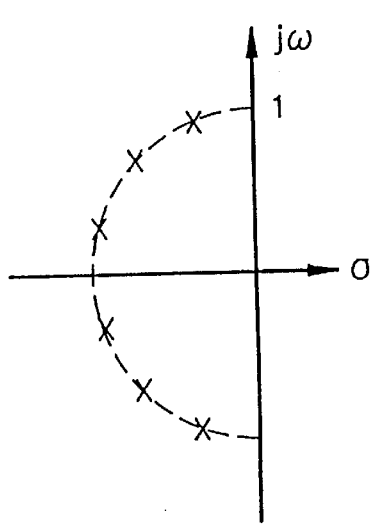
FIGS. 1A and 1B illustrate the root loci in the s-plane for sixth-order Butterworth and Chebychev filters, respectively.

The present invention is particularly well suited for, but not limited to, designing discrete-component, cascaded, active RC filters due to the freedom the method of the present invention provides in selecting filter components. Discrete component active RC filters have a distinct edge over their high-tech counterparts (e.g., Digital and DSP, switched-capacitor and switched-current, continuous-time IC) in that the former provides, for example: (1) fast turn-around time for design and manufacture; (2) low power requirements (e.g., only one operational amplifier required per filter); (3) low cost (e.g., no need for AD/DA converters, anti-aliasing filters, etc.); and (4) moderate size (i.e., smaller than LC filters but larger than IC chips).

In accordance with the present invention, a method for designing higher order cascaded filters is provided which allows discrete-component active RC filters to be manufactured with relatively wide-tolerance RC components while maintaining the cost-effectiveness of these types of filters. However, it will become apparent to those skilled in the art after reading the present application that the impedance tapering method of the present invention is also applicable and is equally advantageous to filters manufactured as integrated circuits. It will also become apparent to those skilled in the art that, although the present invention is described below with respect to active-RC allpole filters, the present invention is not limited to allpole filters, and that the present invention is applicable to filters having both poles and zeros as well as to passive filters. Furthermore, it will become apparent to those skilled in the art that the present invention is not limited to any particular types of filters. The method of the present invention can be used to design, for example, lowpass filters, bandpass filters, band-reject filters, highpass filters, notch filters and state-variable biquad filters. The method of the present invention can also be used to design specific types of these filters, such as, for example, Butterworth filters, Chebyshev filters, Bessel filters, Optimal filters, Parabolic filters and Elliptic filters.

In the interest of brevity, however, the present invention will be described only with respect to Butterworth and Chebyshev filters and, more particularly, with respect to active RC allpole lowpass Butterworth and Chebyshev filters. However, it will become apparent to those skilled in the art after reading the present application that the present invention is in no way limited to the filters discussed below. It will also become apparent to those skilled in the art after reading the present application that the present invention is not limited to any particular order filter and that the method of the present invention can be used to design low sensitivity filters of any order.

The present invention will now be described with respect to the preferred embodiments. In designing low-sensitivity active RC allpole filters, the filter designer generally has three factors to consider:

(i) Component sensitivity increases with inband ripple. Thus, the specifications should be geared towards a low-ripple (or, if possible, maximally-flat) amplitude response. This, in turn, decreases the pole quality factors (Qs);

(ii) Component sensitivity increases with the filter order. The latter should therefore be held as low as possible consistent with the filter specifications. Fortunately, this is standard procedure in filter design and minimizes filter cost;

(iii) Impedance tapering minimizes sensitivity. Using the impedance tapering method of the present invention, the filter circuit can be directly and significantly desensitized with respect to component values and gain at no extra cost. All that is required is that the designer make a judicious choice of component values.

Since it is well known that factors (i) and (ii) must be taken into consideration, and since the present invention is primarily directed to the factor set forth in paragraph (iii), only factor (iii) will be discussed in detail below.

In accordance with the present invention, it has been determined that the larger the impedance tapering factors can be made, the less sensitive the filter circuit will be to component values, i.e., the circuit will have a higher tolerance to variations of the component values. However, the impedance tapering factor cannot be made arbitrarily large because the maximum possible degree of impedance tapering depends directly on the values of the transfer function coefficients. Therefore, in accordance with the present invention, bounds on the impedance tapering factor as a function of the transfer function coefficients will be provided below, both for second and third-order lowpass filters. Sensitivity expressions and design equations are also given below for these filters and data from P SPICE Monte Carlo simulations is provided which shows the effectiveness of the impedance tapering method of the present invention as a means of reducing filter sensitivity to component values and amplifier gain. Because the impedance tapering factors cannot be chosen arbitrarily (since they depend on the transfer function coefficients), a detailed design procedure for selecting the impedance tapering factors is provided below.

Before describing the design procedure of the present invention, sensitivity expressions which define the sensitivity of the transfer function coefficients to component values will be derived and the sensitivity of filters to component values will be shown. In order to demonstrate the sensitivity of filters to component values and to filter order, characteristics of second order, third order, sixth order and nth order filters will be investigated. Once the sensitivity of filters to component values and to filter order has been demonstrated, the sensitivity expressions will be used to derive design equations for designing second and third order filters with low sensitivity to component values and gain. The method of the present invention for designing second and third order filters will then be described in detail. In accordance with the preferred embodiment of the present invention, higher order filters with low sensitivity to component values and gain are designed by cascading second and/or third order filters which have been impedance tapered in accordance with the impedance tapering method of the present invention.

SENSITIVITY OF THE TRANSFER FUNCTION TO COEFFICIENT VARIATIONS

The transfer function $T(s)$ of an nth-order, allpole lowpass filter is:

$$T(s) = \frac{N(S)}{D(S)} = \frac{\beta a_0}{a_n s^n + a_{n-1} s^{n-1} + \cdots a_i s^i + \cdots a_1 s + a_0} \quad \text{(Eq. 1)}$$

Figure 1B:
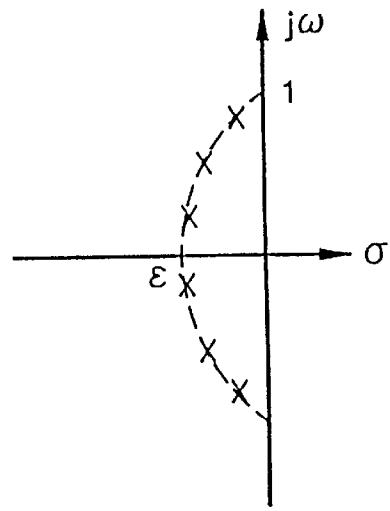
Figure 2A:
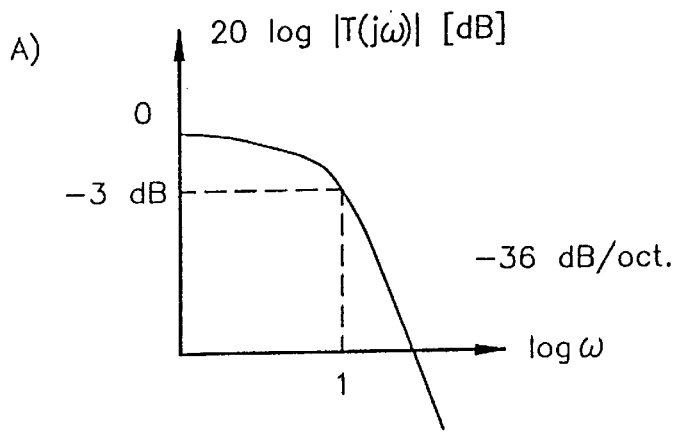
FIGS. 2A and 2B illustrate the amplitude responses for the sixth-order Butterworth and Chebychev filters having the root loci shown in FIGS. 1A and 1B, respectively.
Figure 2B:
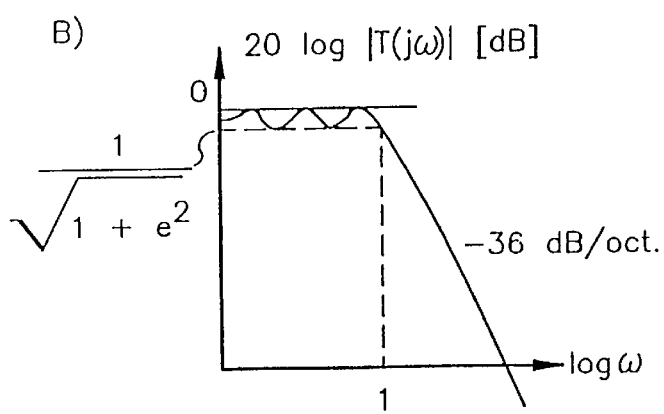

The frequency response of the filter depends on the coefficients $a_i$ of the polynomial $D(s)$. These coefficients are available from any filter handbook or CAD program and determine the location of the poles (i.e., the roots of $D(s)$) in the s-plane. $\beta$ corresponds to the gain of the amplifier of the filter. For example, the poles of a sixth-order Butterworth lowpass filter will lie on a semicircle about the origin in the left half plane and those of a Chebyshev filter will lie on an ellipse. The root loci for these particular filters are shown in FIGS. 1a and 1b, respectively. The larger the ripple of the Chebyshev filter, the smaller the eccentricity $\epsilon$ will be (i.e., the closer the poles will be to the $j\omega$ axis) and the higher the corresponding pole Qs will be. It should be noted, however, that the slope of the asymptotic responses of these two allpole filters of equal order n will be the same, irrespective of the inband ripple. This is shown in the corresponding amplitude responses shown qualitatively in FIGS. 2A and B, respectively. The ripple of the Chebyshev filter is equal to $(1+e^2)^{-\frac{1}{2}}$ where the ellipse eccentricity $\epsilon = \tanh(1/n \sinh^{-1} 1/e)$.

To obtain the sensitivity of the transfer function $T(s)$ (equation 1) to variations of the circuit components, some basic relations in sensitivity theory will be briefly discussed. The relative sensitivity of a function $F(x)$ to variations of a variable x is defined as $$S_x^{F(x)} = \frac{dF/F}{dx/x} = \frac{dF(x)}{dx} \cdot \frac{x}{F(x)} = \frac{d[\ln F(x)]}{d[\ln x]} \quad \text{(Eq. 2)}$$

Thus, the relative variation of $F(x)$ caused by a relative change of x is given by $$\frac{\Delta F(x)}{F(x)} = S_x^{F(x)} \Delta \frac{x}{x} \quad \text{(Eq. 3)}$$

where the difference values $\Delta F$ and $\Delta x$, rather than their differentials $dF$ and $dx$, are used to imply measurable relative quantities, e.g., as given in percentages of their nominal values. The amplitude and phase sensitivity expressions for $T(s)$ are obtained by letting $s=j\omega$, where $$T(s)|_{s=j\omega} = |T(j\omega)| \cdot e^{j\phi(\omega)}$$

$$\ln T(j\omega) = \ln |T(j\omega)| + j\phi(\omega) \quad \text{(Eq. 4)}$$

and $$= \alpha(\omega) + j\phi(\omega) \quad \text{(Eq. 5)}$$

$\alpha(\omega)$ is the amplitude response in Nepers, and $\alpha(\omega)$ is the phase response in degrees. Thus, with equation 2, the following is obtained:

$$S_x^{T(\omega)} = \frac{d[\ln T(j\omega)]}{d(\ln x)} = \frac{d\alpha(\omega)}{d\ln x} + j\frac{d\phi(\omega)}{d\ln x} \quad \text{(Eq. 6)}$$

With the symbol $$\mathcal{S}_x^{F(x)} = \frac{dF(x)}{dx/x} = \frac{dF(x)}{d\ln x} \quad \text{(Eq. 7)}$$

signifying the semi-relative sensitivity of a function $F(x)$ to a relative change in x. The amplitude sensitivity and phase sensitivity expressions for $T(s)$ are given by Equations 8 and 9, respectively, as follows:

$$Re\{S_x^{T(j\omega)}\} = \mathcal{S}_x^{\alpha(\omega)} \quad \text{(Eq. 8)}$$

$$Im\{S_x^{T(j\omega)}\} = \mathcal{S}_x^{\phi(\omega)} \quad \text{(Eq. 9)}$$

The amplitude sensitivity in Equation 8 is given in Nepers [N] per relative change in a real variable x, i.e., $$\Delta\alpha(\omega) = S_x^{x^{\alpha(\omega)}} \Delta\frac{x}{x} \quad \text{(Eq. 10)}$$
$$= \text{Re}\{S_x^{T(j\omega)}\}\Delta\frac{x}{x} \quad [N]$$

Converting the amplitude sensitivity from Nepers to dB per percent component change, the following expression is obtained:

$$\Delta A(\omega)[dB] = \frac{20}{\ln 10}\Delta\alpha(\omega)[N] = 8.68 \cdot \Delta(\omega)[N] \quad \text{(Eq. 11)}$$

Thus, for example, an amplitude variation of 0.1 N corresponds to 0.868 dB, or an amplitude variation of approximately 1 dB.

From the sensitivity expressions presented above, it follows that the relative change of a transfer function T(s), as given, for example, in equation 1, to the variations of its coefficients $a_i$, can be written as:

$$\frac{\Delta T(s)}{T(s)} = \sum_{i=0}^{n} S_{a_i}^{T(s)} \Delta\frac{a_i}{a_i} \quad \text{(Eq. 12)}$$

The relative sensitivity function defined by equation 2 is very useful because with it, the sensitivity of many commonly occurring function types can readily be obtained and compared. To do so, the following simple and easily derivable relationships are used:

$$S_x^{u(x)\cdot v(x)} = S_x^{u(x)} + S_x^{v(x)} \quad \text{(Eq. 13)}$$

$$S_x^{u(x)/v(x)} = S_x^{u(x)} - S_x^{v(x)} \quad \text{(Eq. 14)}$$

$$S_x^{y(x)+c} = \frac{y(x)}{y(x)+c}S_x^{y(x)} \quad \text{(Eq. 15)}$$

$$S_x^{c \cdot y(x)} = S_x^{y(x)} \quad \text{(Eq. 16)}$$

$$S_x^{c \cdot x} = 1 \quad \text{(Eq. 17)}$$

$$S_x^{y^n(x)} = nS_x^{y(x)} \quad \text{(Eq. 18)}$$

$$S_x^{n\sqrt{y(x)}} = 1/n \, S_x^{y(x)} \quad \text{(Eq. 19)}$$

With equations 14, 15 and 16, it readily follows from equation 1 that $$S_{a_i}^{T(s)} = S_{a_i}^{N(s)} - S_{a_i}^{D(s)} \quad i=0, 1, 2, \ldots n \quad \text{(Eq. 20)}$$

Thus $$S_{a_0}^{T(s)} = 1 - \frac{a_0}{D(s)} \quad \text{(Eq. 21)}$$

and for $i \neq 0$ $$S_{a_i}^{T(s)} = \frac{-a_i s^i}{D(s)} \quad \text{(Eq. 22)}$$

Letting $$F_i(s) = \frac{-a_i s^i}{D(s)} \quad i=1, 2, \ldots n \quad \text{(Eq. 23)}$$

and, with equation 21

$$F_0(s) = \frac{a_n s^n = a_{n-1} + \ldots a_1 s}{D(s)} \quad \text{(Eq. 24)}$$

the following is obtained:

$$\Delta\alpha(\omega) = \text{Re}\left\{\sum_{i=0}^{n} F_i(s)\Delta\frac{a_i}{a_i}\right\}_{s=j\omega} \quad \text{(Eq. 25)}$$
$$= \text{Re}\left\{\sum_{i=0}^{n} F_i(j\omega)\Delta\frac{a_i}{a_i}\right\}$$

At this point, two important properties of the coefficients $a_i$ of the denominator polynomial D(s) of a filter are recalled, namely:

(i) the coefficients $a_i$ of D(s) must be real (this applies also to the numerator polynomial) resulting in either real or complex-conjugate poles (and zeros); and (ii) the coefficients $a_i$ of D(s) must be positive (this is one of the conditions for a Hurwitz polynomial) resulting in only left-half plane (LHP) poles (i.e. D(s) must be a Hurwitz polynomial).

From point (i) above, it follows that the $\Delta a_i/a_i$ terms in equation 25 are real, so that this expression can be rewritten as:

$$\Delta\alpha(\omega) = \sum_{i=0}^{n} \text{Re}\{F_i(j\omega)\}\Delta\frac{a_i}{a_i} \quad \text{(Eq. 26)}$$
$$= \sum_{i=0}^{n} f_i(\omega)\Delta\frac{a_i}{a_i}$$

where, for i=1, 2, ... n $$f_i(\omega) = \text{Re}\left\{\frac{-a_i s^i}{D(s)}\right\}_{s=j\omega} \quad \text{(Eq. 27)}$$

and $$f_0(\omega) = \text{Re}\left\{1 - \frac{a_0}{D(s)}\right\}_{s=j\omega} \quad \text{(Eq. 28)}$$

The functions $f_i(\omega)$ are frequency-dependent multiplicands of the coefficient variations $\Delta a_i/a_i$ which cause the amplitude deviation $\Delta\alpha(\omega)$. They depend only on the initial transfer function T(s) of a given filter, or, more specifically, on its denominator coefficients $a_i$.

The third-order allpole transfer function given in terms of the polynomial coefficients $a_i$ (i=0, 1, 2) is:

$$T(s) = \frac{N(s)}{D(s)}\beta \cdot \frac{a_0}{s^3 + a_2 s^2 + a_1 s + a_0} \quad \text{(Eq. 29)}$$

With the negative-real pole $\gamma$ and the complex-conjugate pole pair given in terms of the pole frequency $\omega_p$ and the pole Q, $q_p$, this becomes:

$$T(s) = \frac{\beta\gamma\omega_p^2}{\left(s^2 + \frac{\omega_p}{q_p}s + \omega_p^2\right)(s + \gamma)} \quad \text{(Eq. 30)}$$

This describes a third-order lowpass filter where $\beta$ is the dc gain of its active-RC realization. Assuming that the required filter loss specifications are those given in FIG. 3, the frequency bands correspond to those of a transmit lowpass filter used in ADSL (Asymmnetrical Digital Subscriber-Loop) data transmission systems. Typically $A_{max}$0.5 dB, $A_{min}$=25 dB, and $\beta$=4. For these specifications, the filter coefficients given in Table 1 and die $\gamma$, $\omega_p$ and $q_p$ values given in Table 2 are obtained (e.g., from filter tables or a CAD filter program) as follows.

TABLE 1

Coefficients of 3rd-order lowpass filter

| Filter Type Passband ripple (dB) | $a_2$ | $a_1$ | $a_0$ |
|---|---|---|---|
| Butterworth (0.5) | 1.43 × 10⁶ | 1.02 × 10¹² | 3.64 × 10¹⁷ |
| Chebyshev (0.5) | 6.3 × 10⁶ | 3.88 × 10¹¹ | 9.09 × 10¹⁶ |

TABLE 2

Pole frequency and Q (i.e. $\omega_p$ and $q_p$) for the poles of a 3rd order lowpass filter with denominator

| Filter Type | $\gamma$ | $\omega_p$ | $q_p$ |
|---|---|---|---|
| Butterworth (0.5 dB ripple) | 713.727 × 10³ | 713.727 × 10³ | 1.0 |
| Chebyshev (0.5 dB ripple) | 314.891 × 10³ | 537.264 × 10³ | 1.71 |

Figure 4A:
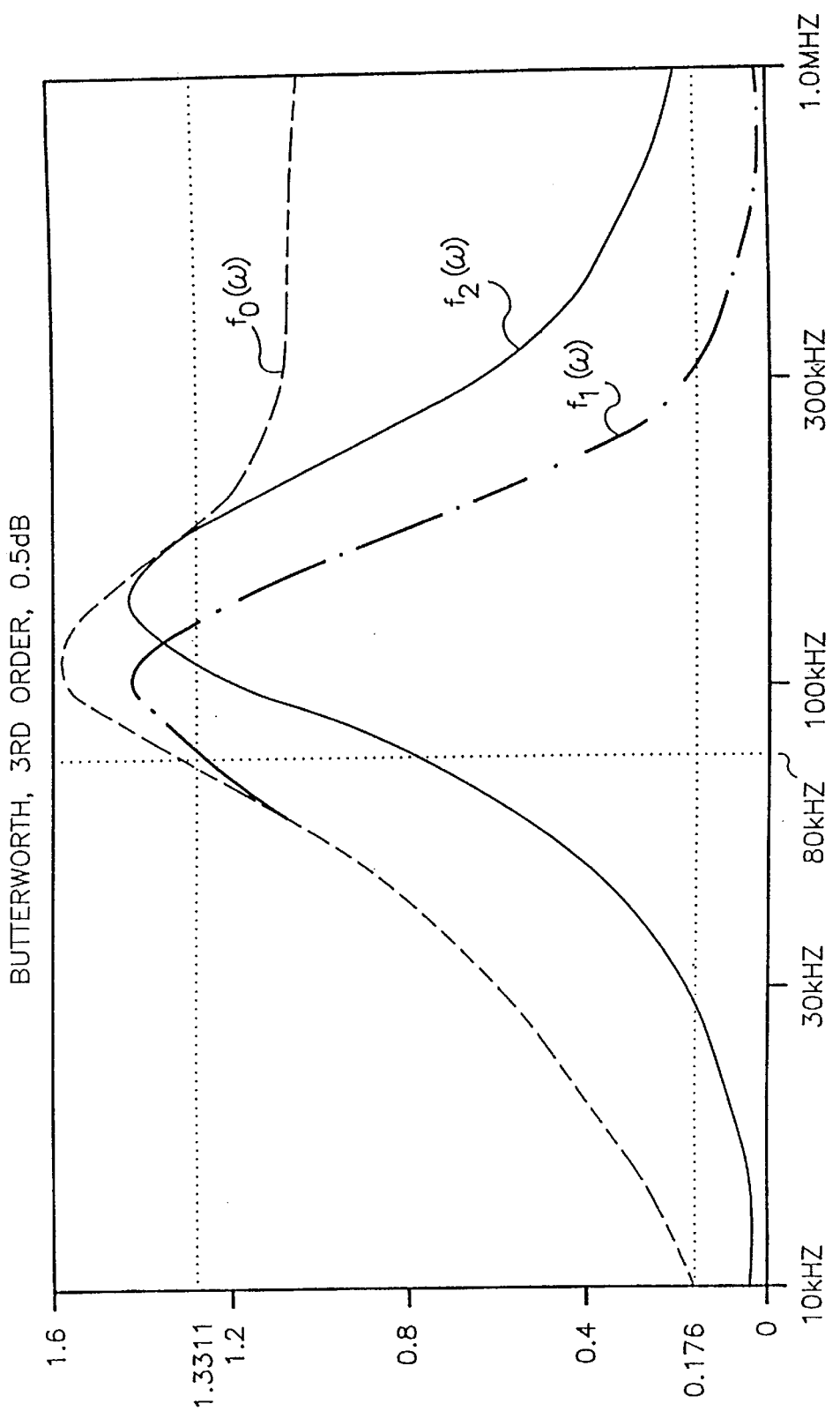
FIGS. 4A and 4B illustrate the frequency responses for a third-order Butterworth filter and a third-order Chebychev filter, respectively.
Figure 4B:
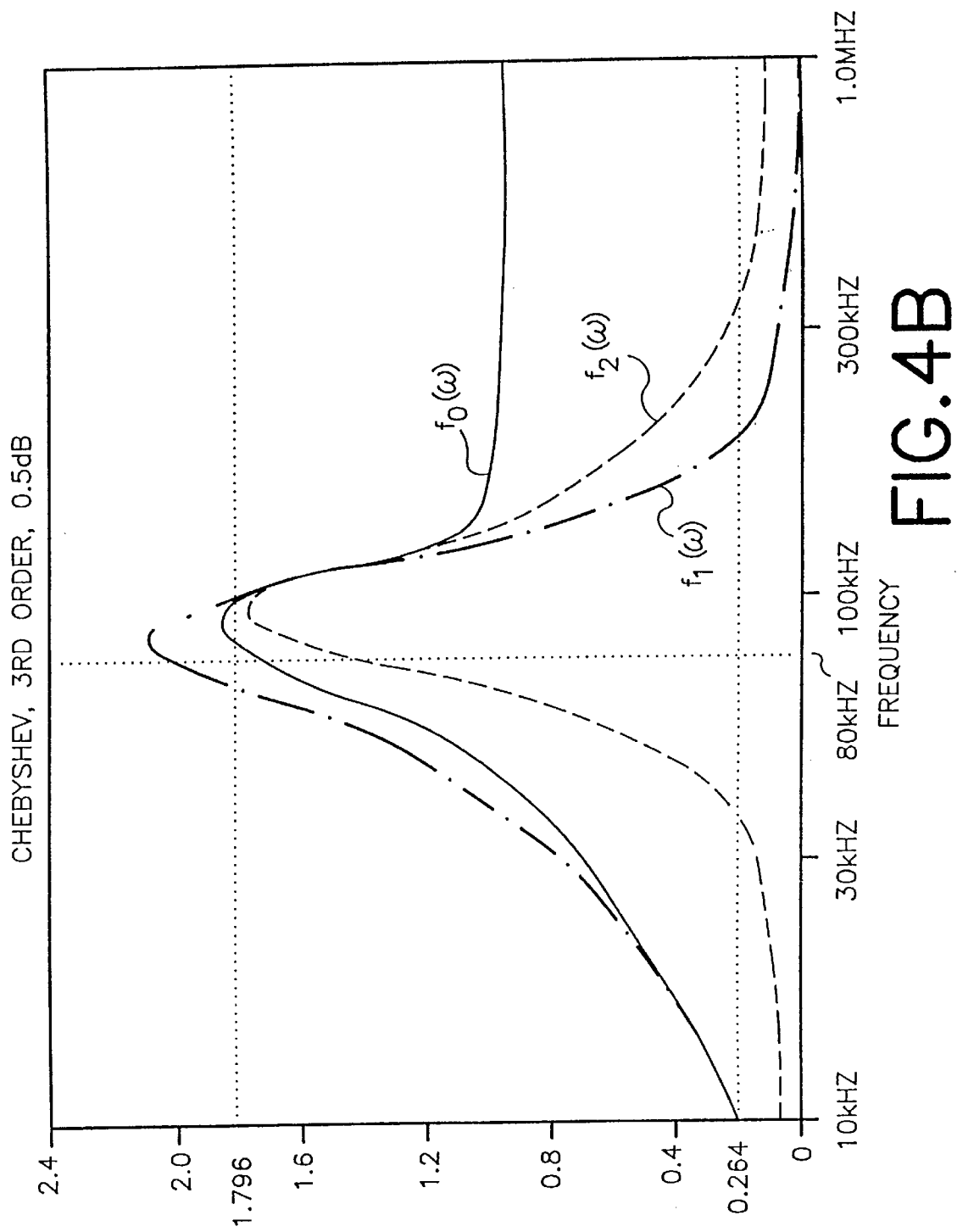

Calculating the functions (see eqs. (27) and (28)):

$$f^i(\omega) = \operatorname{Re}\left\{\frac{-a_i s^i}{D(s)}\right\}_{s=j\omega} \quad i = 1, 2 \quad \text{(Eq. 31)}$$

and $$f_0(\omega) = \operatorname{Re}\{S_{a_0}^{T(s)}\}_{s=j\omega} = \operatorname{Re}\left\{1 - \frac{a_0}{D(s)}\right\}_{s=j\omega} \quad \text{(Eq. 32)}$$

$$= \operatorname{Re}\left\{\frac{a_3 s^3 + a_2 s^2 + a_1 s}{a_3 s^3 + a_2 s^2 + a_1 s + a_0}\right\}_{s=j\omega}$$

and where $a_3$=1, the functions plotted in FIGS. 4A and 4B are obtained. Note that the highest sensitivity of the amplitude response $\alpha(\omega)$ to coefficient variations is just beyond the cutoff frequency of 80 KHz. Moreover, the sensitivity of the Chebyshev transfer function to coefficient variations is larger than that of the Butterworth filter (the maximum occurs for $f_0(\omega)$) [Butterworth] with approximately 1.6, and for $f_1(\omega)$ [Chebyshev] with approximately 2.0). The distribution of the three functions along the frequency axis for the two filters is similar, primarily because the pole locations of the two filters do not differ greatly. Within the passband, i.e., below 80 KHz, the sensitivity curve of the $a_2$ coefficient, i.e., $f_2(\omega)$), is lowest for both filters whereas for the $a_1$ and $a_0$ coefficients (i.e., $f_1(\omega)$ and $f_0(\omega)$ it is approximately the same.

The transfer function of a 6th-order Butterworth and Chebyshev allpole lowpass filter is expressed as:

$$T(s) = \frac{\beta a_0}{s^2 + a_5 s^5 + a_4 s^4 + a_3 s^3 + a_2 s^2 + a_1 s + a_0} \quad \text{(Eq. 33)}$$

Figure 3:
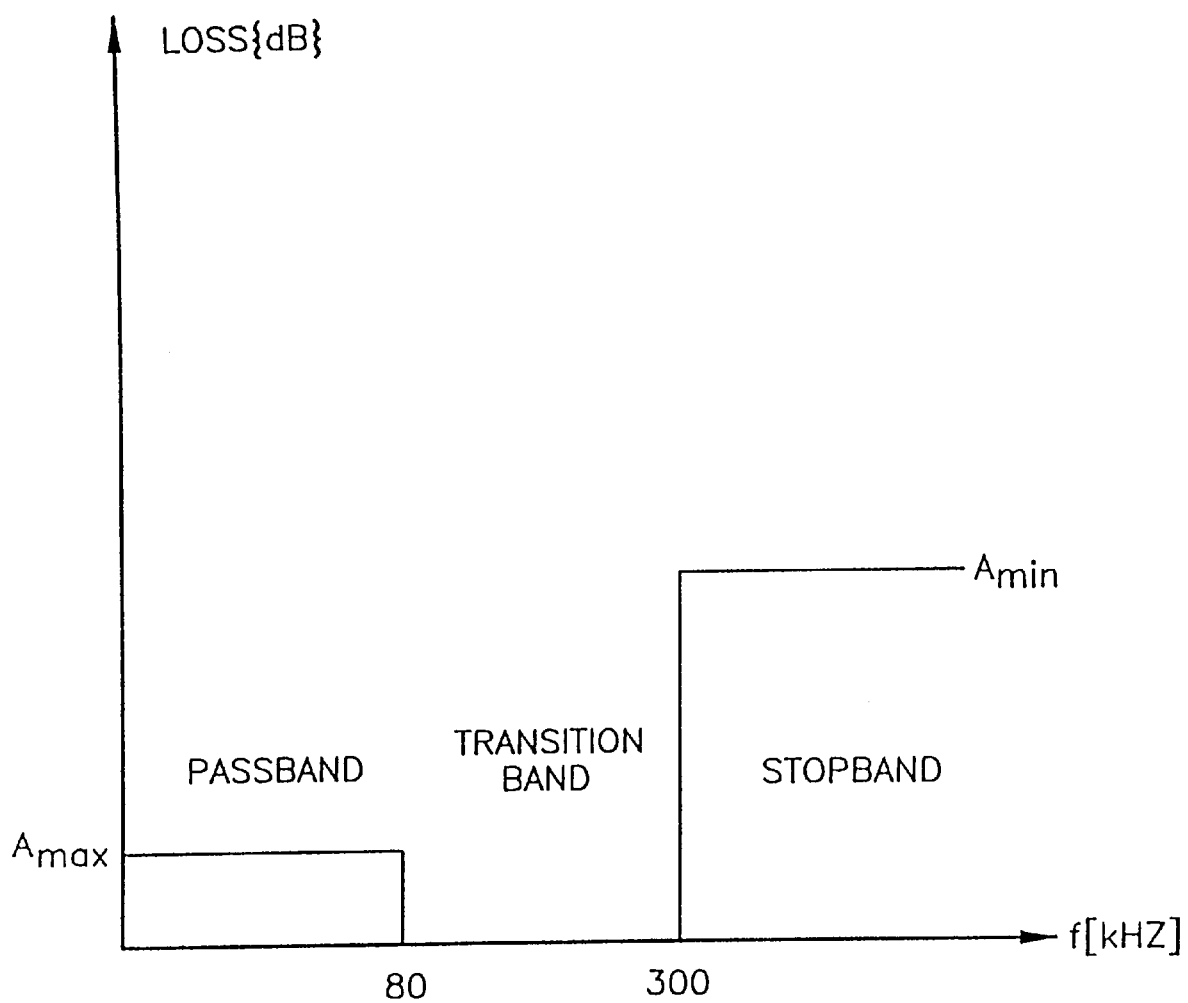
FIG. 3 illustrates the loss specifications for a third-order lowpass active RC filter.

Assuming the filter specifications in FIG. 3 to be $A_{max}$= 0.1 dB and $A_{min}$=50 dB, the following filter coefficients are obtained:

TABLE 3

Coefficients of 6th-order lowpass filter

| Filtertype Passband ripple (dB) | $a_5$ | $a_4$ | $a_3$ | $a_2$ | $a_1$ | $a_0$ |
|---|---|---|---|---|---|---|
| Butterworth (0.1) | 2.66 × 10⁶ | 3.53 × 10¹² | 2.97 × 10¹⁸ | 1.67 × 10²⁴ | 5.94 × 10²⁹ | 1.06 × 10³⁵ |
| Chebyshev (0.1) | 8.61 × 10⁵ | 7.49 × 10¹¹ | 3.53 × 10¹⁷ | 1.31 × 10²³ | 2.89 × 10²⁸ | 3.34 × 10³³ |

Figure 5A:
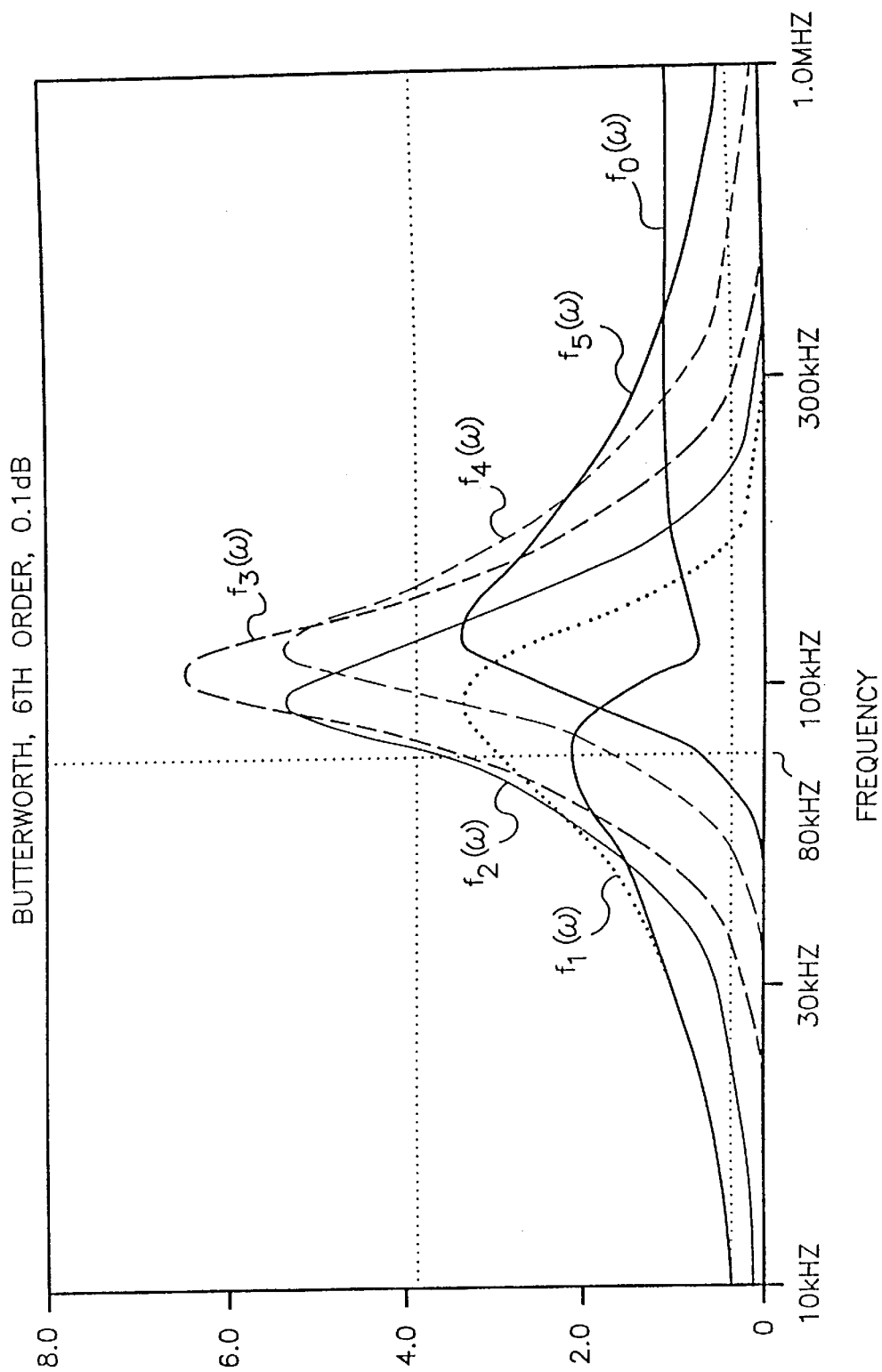
FIGS. 5A and 5B illustrate the frequency responses for a sixth-order Butterworth filter and a sixth-order Chebychev filter, respectively.
Figure 5B:
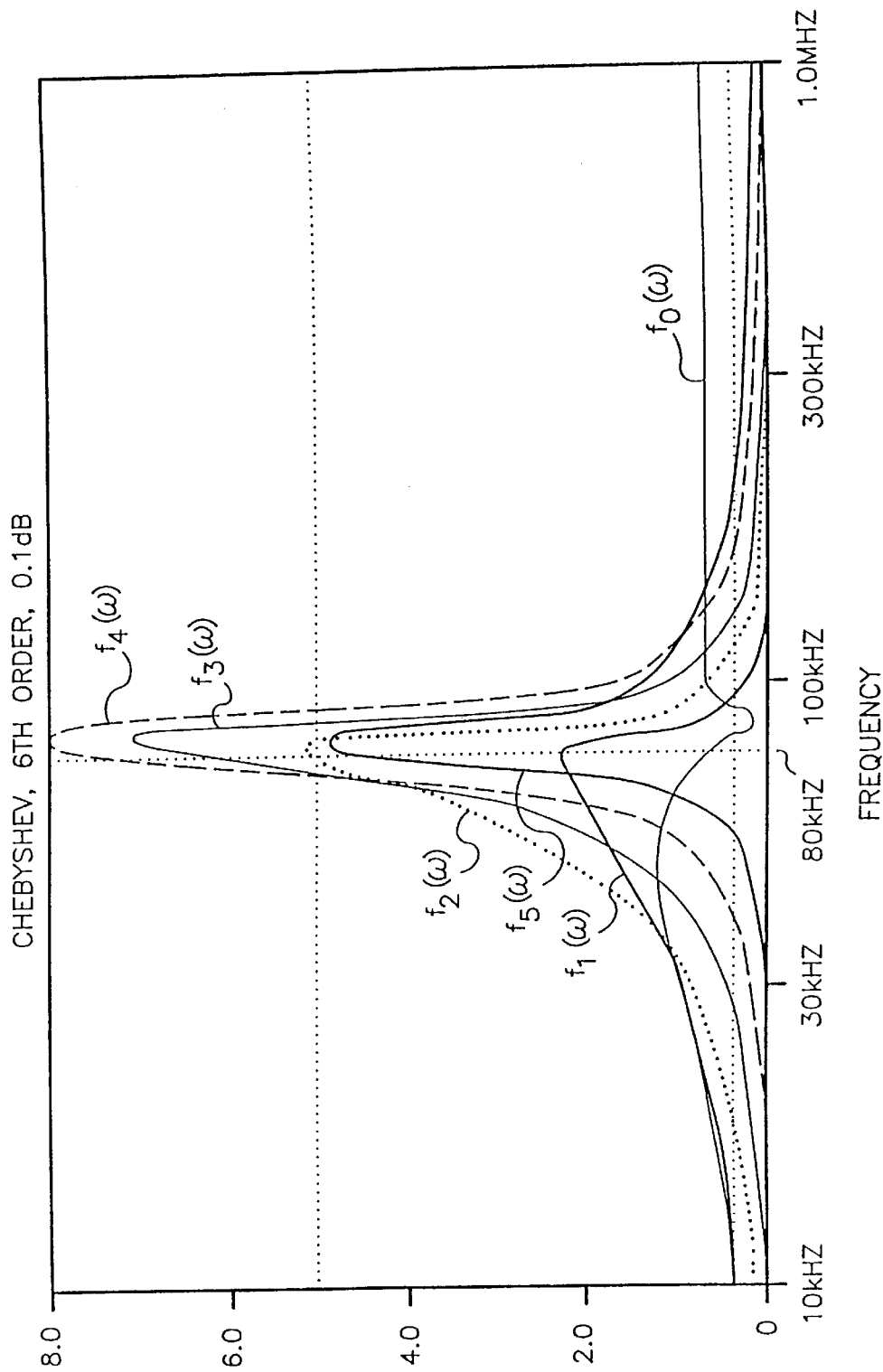

Calculating the corresponding coefficient-sensitivity functions $f_i(\omega)$, for i=0, 1, . . . 5, as in equations 27 and 28, the frequency response plots shown in FIGS. 5A and 5B are obtained. As in the third-order case (FIGS. 4A and 4B), the coefficient sensitivities for the Chebyshev filters are significantly higher (up to double) than those of the Butterworth filters. One reason for this is that the amplitude sensitivity is proportional to the pole quality factors, and these are higher for the Chebyshev than for the Butterworth filter, as a comparison of Tables 2 (above) and 4 (below) shows. In fact, it will be shown below that the sensitivity of the coefficients to component values is also critically dependent on the pole quality factors. It should be noted that for the Butterworth filter, $\omega_p$ is constant (i.e., 687.598×10³) for the three biquad sections, because the poles of a Butterworth filter lie on a semicircle with radius $\omega_p$. For the Chebyshev filter, the poles lie on an ellipse. Therefore, the $\omega_p$ values differ for each biquad section.

TABLE 4

Pole frequency and Q (i.e., $\omega_p$ and $q_p$) for the three pole pairs of a 6th order lowpass filter

| Filter Type | Section no. | $q_p$ | $\omega_p$ |
|---|---|---|---|
| Butterworth (0.1 dB ripple) | 1 | 0.518 | 687.598 × 10³ |
|  | 2 | 0.707 | 687.598 × 10³ |
|  | 3 | 1.93 | 687.598 × 10³ |
| Chebyshev (0.1 dB ripple) | 1 | 0.599 | 257.956 × 10³ |
|  | 2 | 1.33 | 419.460 × 10³ |
|  | 3 | 4.63 | 534.184 × 10³ |

Figure 6:
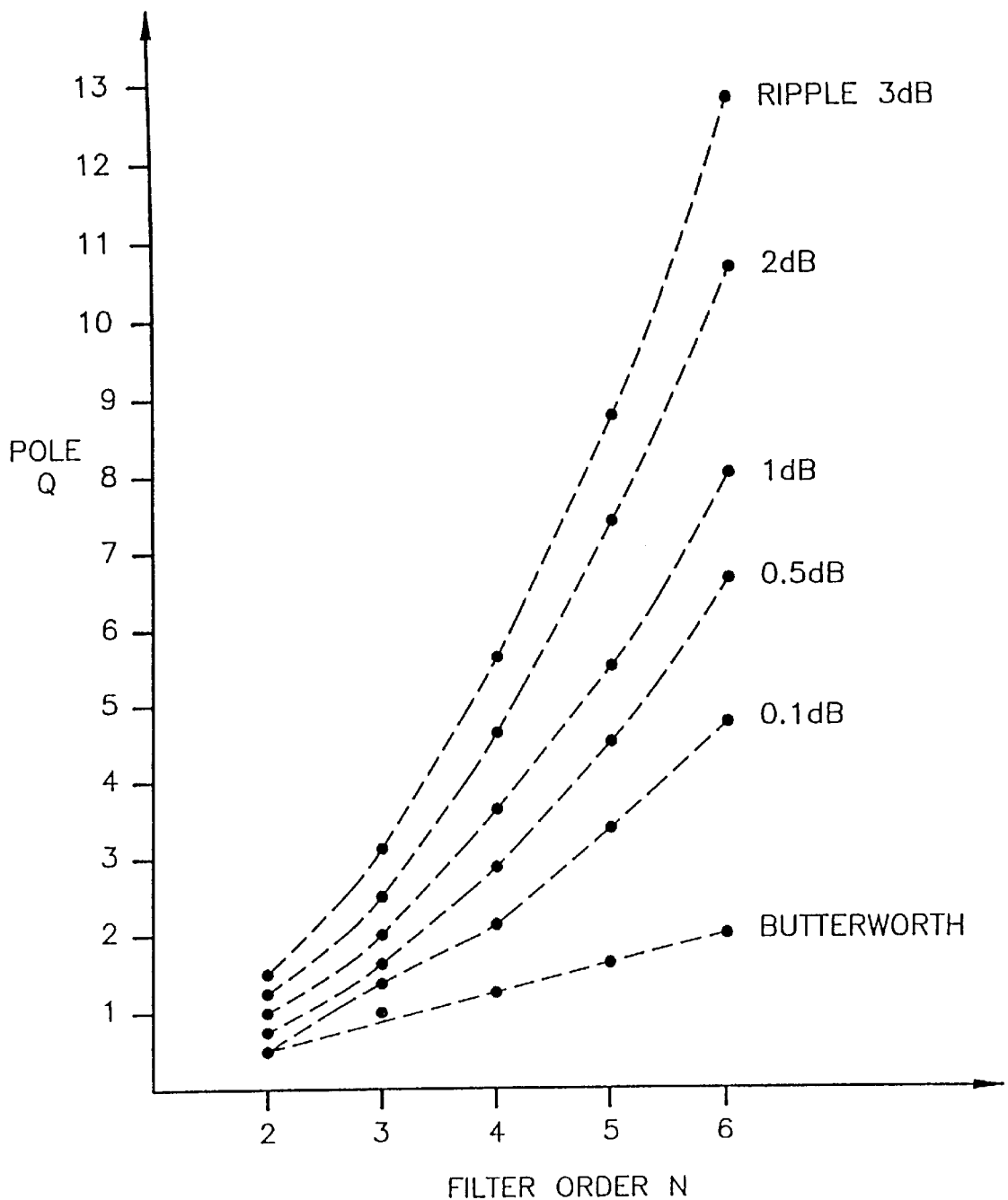
FIG. 6 graphically compares the ripple for Butterworth and Chebychev filters as a function of second through sixth order as a function of pole quality factor.

It should be noted that the frequency dependent sensitivity functions $f_i(\omega)$ plotted in FIGS. 4A–B and 5A–B depend only on the generic filter type (e.g., Chebyshev or Butterworth) but not on the actual circuit used to realize the filter. Thus, they depend on the given filter specifications and on the required filter order. This, in turn, will affect the filter cost, since the number of required filter components generally depends on the filter order. Economics aside, however, the sensitivity functions shown demonstrate a direct dependence of sensitivity on the quality factors of the transfer function poles: the higher the pole quality factors the higher the sensitivity. Therefore, it can be concluded that in order to design a filter with low sensitivity to its component values, the filter with the lowest possible pole quality factors (consistent with the filter specifications) should be used. Thus, for example, with respect to sensitivity, a Butterworth filter is preferable to a Chebyshev filter and, likewise, a low-ripple Chebyshev filter is preferable to a Chebyshev filter with higher ripple. Unfortunately, this preference frequently conflicts with cost, since the lower the ripple, for a given filter specification, the higher the required order will generally be. A Butterworth filter, with its "maximally flat" amplitude response corresponds to the limit case of no ripple in the filter passband and, compared to a Chebyshev filter of equal order, invariably has lower pole quality factors (Qs). This is illustrated in FIG. 6 where the highest pole Q of 2nd to 6th-order Butterworth and Chebyshev filters of varying-ripple is shown. FIG. 6 clearly indicates that in order to keep the pole quality factors at a minimum for the sake of low filter sensitivity to coefficient variations, it is desirable to design the filter with as low ripple and as low order as consistent with the filter specifications.

SENSITIVITY OF THE COEFFICIENTS TO COMPONENT VARIATIONS

As demonstrated above, the variation of the amplitude response $\alpha(\omega)$ of an allpole filter (i.e., no finite zeros) caused by changes in the coefficients $a_i$ of the corresponding filter transfer function is given by:

$$\Delta\alpha(\omega) = \sum_{i=0}^{n} f_i(\omega) \Delta \frac{a_i}{a_i} \quad \text{(Eq. 34)}$$

where the frequency functions $f_i(\omega)$ depend only on the type of filter used (e.g., Chebyshev, Butterworth, etc.). On the other hand, the coefficient variations $\Delta a_i/a_i$ depend on the circuit type used to design the filter (e.g., positive or negative feedback, etc.) and on the values of the circuit components used to obtain a given transfer function T(s), such as that given by equation 1. Furthermore, it has been shown above that variations in the frequency dependent functions $f_i(\omega)$ and in the coefficients $\Delta a_i/a_i$ will be all the larger the higher the pole Qs of the filter. Consequently, the passband ripple will also be larger the higher the pole Q's are (see FIG. 6).

The sensitivity of the coefficients $a_i$ to variations of the circuit components (i.e., the resistors, capacitors, and amplifiers) making up the filter will now be examined. For the purpose of illustration, the representative nth-order general allpole single-amplifier filter structure shown in FIG. 7 will be used to illustrate the sensitivity of the transfer function coefficients to component value variations. This is a lowpass filter, but any other filter (e.g., highpass or bandpass) could also be used for this purpose. The transfer function of this filter will have the form of equation 1. The amplitude variation due to coefficient variations is given by equation 34 above. The coefficients $a_i$ are functions of the resistors, the capacitors and the gain $\beta$. Thus, using equation 3, the coefficient variations can be expressed in the form:

$$\frac{\Delta a_i}{a_i} = \sum_{\mu=1}^{r} S_{R_\mu}^{a_i} \Delta \frac{R_\mu}{R_\mu} + \sum_{v=1}^{c} S_{C_v}^{a_i} \Delta \frac{C_v}{C_v} + S_\beta^{a_i} \frac{\Delta\beta}{\beta} \quad \text{(Eq. 35)}$$

In general, the individual resistors $R_\mu$, capacitors $C_v$, and gain-determining resistors will be characterized by their mean $\mu_x$, and standard deviation $\sigma_x$, where x represents each of the component types (e.g., resistors or capacitors). The coefficient variations $\Delta a_i/a_i$ will then be random variables whose statistical behavior is a function of the components on which they depend.

In what follows, the coefficient-to-component sensitivity is derived analytically for the second, third and nth-order allpole filters. The resulting expressions provide insight into the methods of the present invention for deterministically reducing this sensitivity. To examine the efficacy of these methods, data obtained from testing using P SPICE Monte Carlo analysis with given component statistics will be provided. It will thus be shown that the method of the present invention for minimizing the sensitivity of filters is indeed very effective in reducing frequency response variations caused by component value variations.

SENSITIVITY EXPRESSIONS FOR THE SECOND ORDER FILTER

Figure 8A:
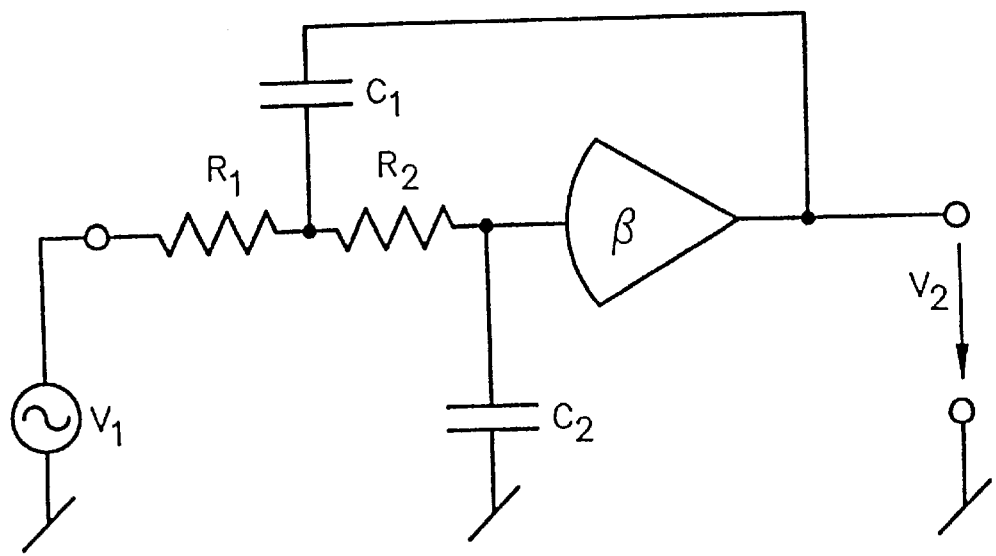
FIG. 8A illustrates a second order lowpass filter circuit comprising an ideal noninverting voltage amplifier.
Figure 8B:
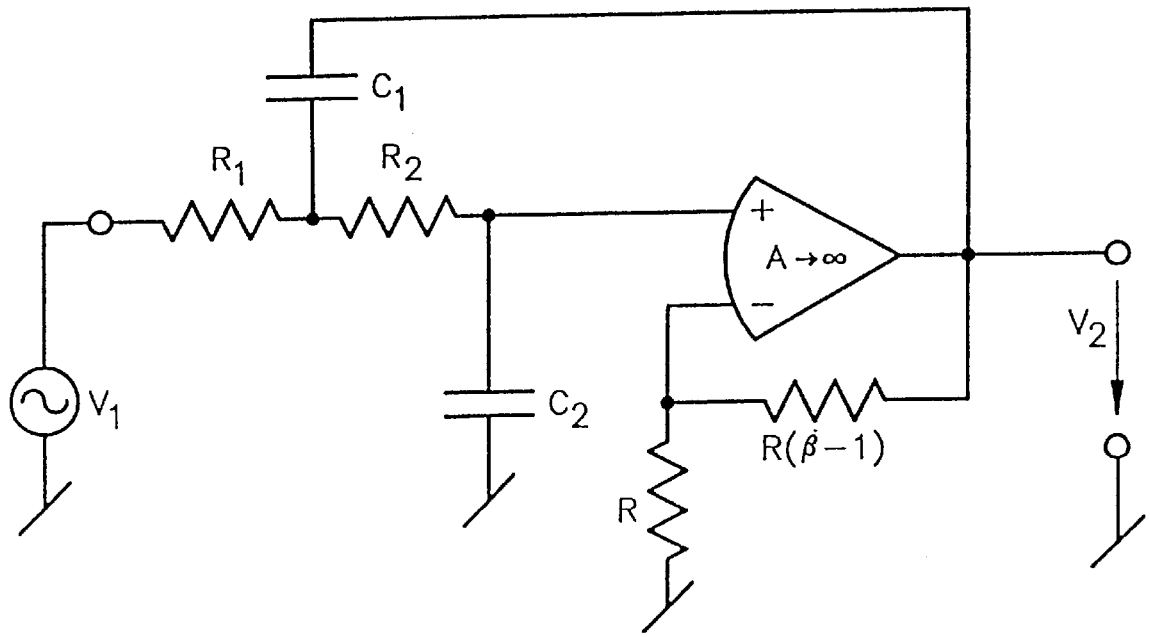
FIG. 8B illustrates a second order lowpass filter circuit comprising an ideal noninverting operational amplifier.

FIG. 8A illustrates a second-order lowpass filter. In FIG. 8B, the ideal noninverting voltage amplifier with gain $\beta$ of FIG. 8A has been replaced by an ideal noninverting operational amplifier. The voltage transfer function for this circuit (known as class 4 or Sallen and Key) expressed in terms of the coefficients $a_i$ is given by:

$$T(s) = \frac{\beta a_0}{s^2 + a_1 s + a_0} \quad \text{(Eq. 36)}$$

and in terms of the pole frequency $\omega_p$ and pole Q, $q_p$, by:

$$T(s) = \frac{\beta \omega_p^2}{s^2 + \frac{\omega_p}{q_p} s + \omega_p^2} \quad \text{(Eq. 37)}$$

where $$a_0 = \omega_p^2 = \frac{1}{R_1 R_2 C_1 C_2} \quad \text{(Eq. 38)}$$

and $$a_1 = \frac{\omega_p}{q_p} = \frac{R_1(C_1 + C_2) + R_2 C_2 - \beta R_1 C_1}{R_1 R_2 C_1 C_2} \quad \text{(Eq. 39)}$$

Considering the overall variation of coefficient $a_0$, the following is obtained from the general expression of equation 35:

$$\frac{\Delta a_0}{a_0} = \sum_{\mu=1}^{2} S_{R_\mu}^{a_0} \Delta \frac{R_\mu}{R_\mu} + \sum_{V=1}^{2} S_{C_v}^{a_0} \Delta \frac{C_v}{C_v} + S_\beta^{a_0} \frac{\Delta\beta}{\beta} \quad \text{(Eq. 40)}$$

With the sensitivity expressions of equations 13–19 it follows that:

$$S_x^{a_0} = 2 S_x^{\omega_p} \quad \text{(Eq. 41)}$$

and $$S_{R_i}^{a_0} = S_C^{a_p} = -1 \quad i=1, 2 \quad \text{(Eq. 42)}$$

Thus:

$$\frac{\Delta a_0}{a_0} = -\left( \sum_{\mu=1}^{2} \frac{\Delta R_\mu}{R_\mu} + \sum_{v=1}^{2} \frac{\Delta C_v}{C_v} \right) \quad \text{(Eq. 43)}$$

and $$\frac{\Delta \omega_p}{\omega_p} = \frac{1}{2}\Delta\frac{a_0}{a_0} \qquad \text{(Eq. 44)}$$

Furthermore, the mean of $\Delta a_0/a_0$ will equal the negative sum of the means of all $R_\mu$ and $C_\nu$ and the variance will be the positive sum of their variances. Note that since the sensitivity of $a_0$ to all components x is $-1$ (and to the gain $\beta$, it is zero), there is nothing that can be done with regard to circuit design that will effect the component sensitivity of $a_0$. The only possible measures which can be used to decrease $\Delta a_0/a_0$ are technological, i.e., $\Delta a_0/a_0$ can be decreased only by prescribing the quality, precision, temperature coefficient, aging behavior, etc., of the resistors and capacitors. This conclusion is true for all filters of the type shown in FIG. 7, regardless of their order n.

Next, the variation of $a_1$ due to component values will be considered. From equation 35, the following is obtained:

$$\frac{\Delta a_1}{a_1} = \sum_{\mu=1}^{2} S_{R_\mu}^{a_1} \Delta\frac{R_\mu}{R_\mu} + \sum_{\nu=1}^{2} S_{C_\nu}^{a_1} \Delta\frac{C_\nu}{C_\nu} + S_\beta^{a_1}\frac{\Delta\beta}{\beta} \qquad \text{(Eq. 45)}$$

With Equation 39 and the expressions of equations 13–19, the following is obtained:

$$S_{R_1}^{a_1} = -\frac{1}{a_1 R_1 C_1} \qquad \text{(Eq. 46)}$$

$$= -q_p\sqrt{\frac{R_2 C_2}{R_1 C_1}}$$

In the second part of equation 46, the fact that $a_1 = \omega_p/q_p$ and that $\omega_p = (R_1 R_2 C_1 C_2)^{-\frac{1}{2}}$ has been utilized. Similarly, for the sensitivities of a1 to the remaining components, the following is obtained:

$$S_{R_2}^{a_1} = -\frac{1}{a_1 R_2 C_2}\left(1 + \frac{C_2}{C_1} - \beta\right) \qquad \text{(Eq. 47)}$$

$$= q_p\sqrt{\frac{R_1 C_1}{R_2 C_2}}\left(1 + \frac{C_2}{C_1} - \beta\right) \qquad \text{(Eq. 48)}$$

$$S_{C_1}^{a_1} = -\frac{1}{a_1}\left(\frac{1}{R_1 C_1} + \frac{1}{R_2 C_1}\right) \qquad \text{(Eq. 49)}$$

$$= -q_p\left(\sqrt{\frac{R_1 C_2}{R_2 C_1}} + \sqrt{\frac{R_2 C_2}{R_1 C_1}}\right)$$

$$S_{C_2}^{a_1} = -\frac{1}{a_1}R_1\frac{C_1(1-\beta)}{R_1 R_2 C_1 C_2} \qquad \text{(Eq. 50)}$$

$$= -q_p\sqrt{\frac{R_1 C_1}{R_2 C_2}}(1-\beta)$$

The last expression results from equation 38, since $\omega_p$ is independent of $\beta$. Calculating $q_p$ from equations 38 and 39, the following is obtained:

$$q_p = \frac{\kappa_1}{\kappa_2 - \beta\kappa_3} \qquad \text{(Eq. 51)}$$

where $$\kappa_1 = \sqrt{R_1 R_2 C_1 C_2} \qquad \text{(Eq. 52)}$$

$$\kappa_2 = R_1 C_1 + R_2 C_2 + R_1 C_2 \qquad \text{(Eq. 53)}$$

$$\kappa_3 = R_1 C_1 \qquad \text{(Eq. 54)}$$

Denoting the pole Q of the passive network (i.e. $\beta=0$) by q, i.e., $$\hat{q} = q_p(\beta=0) = \kappa_1/\kappa_2 \qquad \text{(Eq. 55)}$$

equation 56 is obtained from the sensitivity expressions of equations 13–19:

$$S_\beta^{q_p} = \frac{q_p}{\hat{q}} - 1 \qquad \text{(Eq. 56)}$$

and $$S_\beta^{a_1} = -\left(\frac{q_p}{\hat{q}} + 1\right) \qquad \text{(Eq. 57)}$$

The coefficient sensitivities given above are all proportional to the pole quality factor, $q_p$. Thus, in deciding on a filter type for a given application, preferably the one yielding the lowest pole Qs will be selected. This means that a low ripple or maximally flat filter should be used if possible, with as low a filter degree n as the specifications will allow (see FIG. 6).

From equations 56 and 57 it follows that the coefficient (or $q_p$) sensitivity to the gain is inversely proportional to the passive RC pole quality factor, q. Thus, once the filter type has been chosen, it should be designed so that the passive pole quality factor, q, is as large as possible. Since a passive RC network can have only negative-real, single poles, it follows that q is limited to less than 0.5. The upper bound of 0.5 cannot actually be reached, since this entails a component spread approaching infinity. This can be easily shown for the circuit of FIG. 7. From equations 51–54, the following expression is obtained:

$$\hat{q} = q_p(\beta=0) = \frac{\kappa_1}{\kappa_2} = \frac{\sqrt{R_1 R_2 C_1 C_2}}{R_1 C_1 + R_2 C_2 + R_1 C_2} \qquad \text{(Eq. 58)}$$

Inverting this expression, the following is obtained:

$$\frac{1}{\hat{q}} = \sqrt{\frac{R_1 C_1}{R_2 C_2}} + \sqrt{\frac{R_2 C_2}{R_1 C_1}} + \sqrt{\frac{R_1 C_1}{R_2 C_1}} \qquad \text{(Eq. 59)}$$

Letting $$x = \sqrt{\frac{R_1 C_1}{R_2 C_2}} \qquad \text{(Eq. 60)}$$

equation 59 takes on the form:

$$\frac{1}{\hat{q}} = x + \frac{1}{x} + \sqrt{\frac{R_1 R_2}{R_2 C_1}} \qquad \text{(Eq. 61)}$$

Since the function $y = x + x^{-1}$ reaches its minimum value, namely 2, for $x=1$, it follows from equation 61 that for $R_1 C_1 = R_2 C_2$:

$$\frac{1}{\hat{q}} = 2 + \frac{C_2}{C_1} \qquad \text{(Eq. 62)}$$

This quantity approaches its minimum value only when the capacitor spread $C_2/C_1$ approaches zero. In other words, the maximum value $q_{max}=0.5$ is reached only in the limit, as $C_2/C_1$ approaches zero and $R_1C_1=R_2C_2$.

Figure 9:
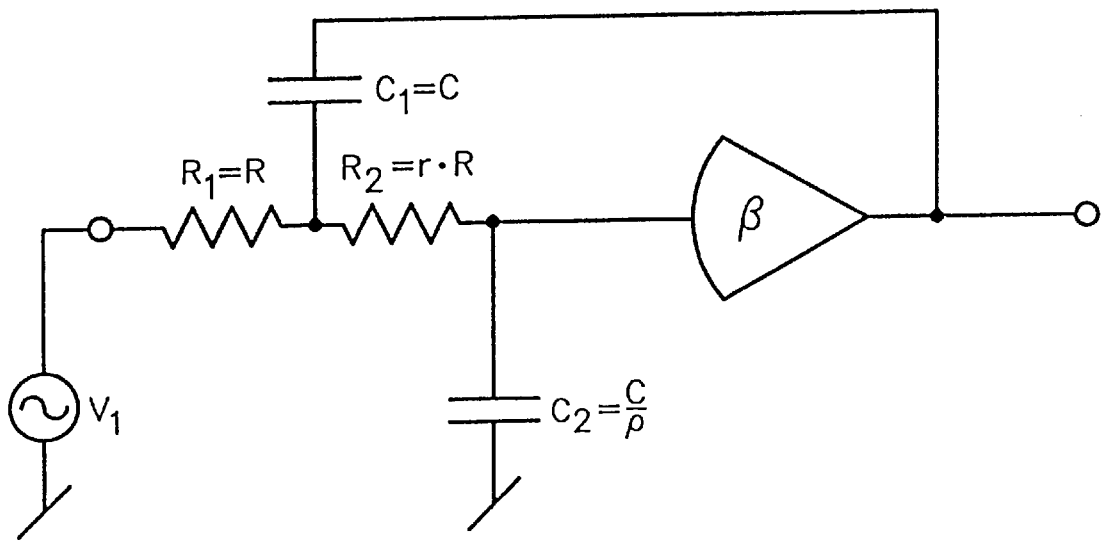
FIG. 9 corresponds to the filter circuit of FIG. 8A redrawn with impedance scaling factors in accordance with the impedance tapering method of the present invention.

This result can be generalized as follows. It can be shown that the pole Q, q of an RC ladder-type structure can be maximized by impedance scaling the second L-section of the ladder so as to minimize the loading on the first L section. For example, referring to FIG. 8A, the second L-section comprising $R_2$ and $C_2$ can be impedance scaled upwards so as to minimize the loading on the first, i.e., on $R_1$ and $C_1$. Referring to FIG. 9, in which the active RC lowpass filter of FIG. 8A has been redrawn with impedance scaling factors r and $\rho$ for $R_2$ and $C_2$, respectively, i.e., $$R_1=R;\ C_1=C$$

$$R_2=rR;\ C_2=C/\rho \qquad \text{(Eq. 63)}$$

the following is obtained:

$$\hat{q} = \frac{\sqrt{r\rho}}{1+r+\rho} \qquad \text{(Eq. 64)}$$

and for $r=\rho$:

$$\hat{q} = \frac{\rho}{1+2\rho}\bigg|_{\rho \to \infty} = 0.5 \qquad \text{(Eq. 65)}$$

Figure 10:
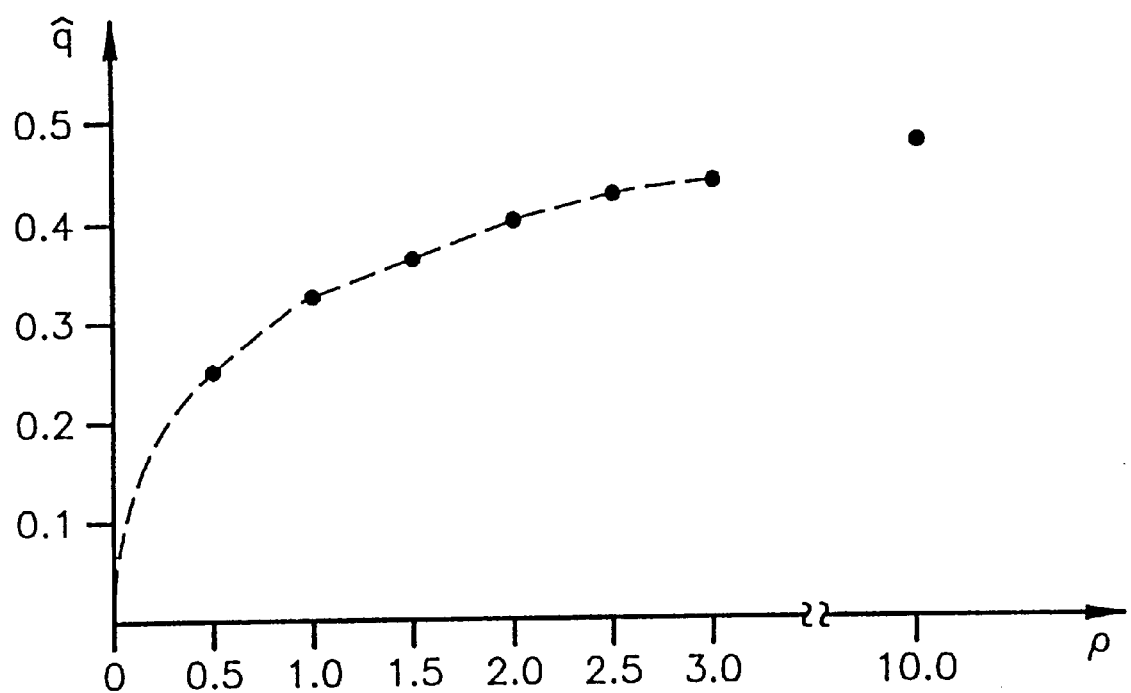
FIG. 10 graphically illustrates the effect the impedance tapering method of the present invention has on the pole quality factor.

Thus, impedance scaling $R_2$ and $C_2$ by a value of $\rho>1$, q will approach 0.5 and the sensitivity of $a_1$ (or $q_p$) to $\beta$ will, according to equation 56, be minimized. In accordance with the present invention, it has been determined that $\rho$ does not have to be that much larger than unity to be effective, as the plot of q versus $\rho$ shows in FIG. 10. This is fortunate since, in practice, a large $\rho$ may cause $C_2$ to decrease into the range of the parasitic capacitance of the circuit. From FIG. 10 it is apparent that a value of $\rho$ between 2 and 3 will bring q close to its upper boundary of 0.5.

IMPEDANCE TAPERING THE SECOND ORDER FILTER

It will now be shown that impedance scaling with a factor $\rho>1$ will also decrease the other coefficient sensitivities, given by equations 46–50. Inserting the expressions in equation 63 into equations 46 through 50, the sensitivity relations given below are obtained. Although ideal impedance scaling requires that $r=\rho$, this may not always be possible, since a given design may require two degrees of freedom, i.e., freedom in choosing both $\rho$ and r. Both sets of expressions, namely those for $r=\rho$ and for $r\neq\rho$, are given below.

$$S^{a_1}_{R_1} = -q_P\sqrt{\frac{r}{\rho}}\bigg|_{r=\rho} = -q_P \qquad \text{(Eq. 66)}$$

$$S^{a_1}_{R_2} = -q_P\left[\sqrt{\frac{\rho}{r}}(1-\beta) + \frac{1}{\sqrt{\rho r}}\right]_{r=\rho} = -q_P\left(1-\beta+\frac{1}{\rho}\right) \qquad \text{(Eq. 67)}$$

$$S^{a_1}_{C_2} = q_P\left(\sqrt{\frac{r}{\rho}}(1-\beta)\right)_{r=\rho} - q_P\left(1+\frac{1}{\rho}\right) \qquad \text{(Eq. 68)}$$

$$S^{a_1}_{C_2} = q_P\sqrt{\frac{\rho}{r}}(1-\beta)\bigg|_{r=\rho} - q_P(1-\beta) \qquad \text{(Eq. 69)}$$

Clearly, ideal impedance scaling (in which case $\rho=r>1$) also reduces the coefficient sensitivities to the gain $\beta$ but also to the other components. If r is required to be unequal to $\rho$ (for reasons of design flexibility), then increasing only the capacitor ratio $\rho$ or, alternatively, increasing only r, will also reduce the sensitivities. Even though equations 67 and 69 include a term $(\rho/r)^{1/2}(1-\beta)$, this term will be small or even zero, since the gain $\beta$ will generally be in the range between unity and two.

Figure 11A:
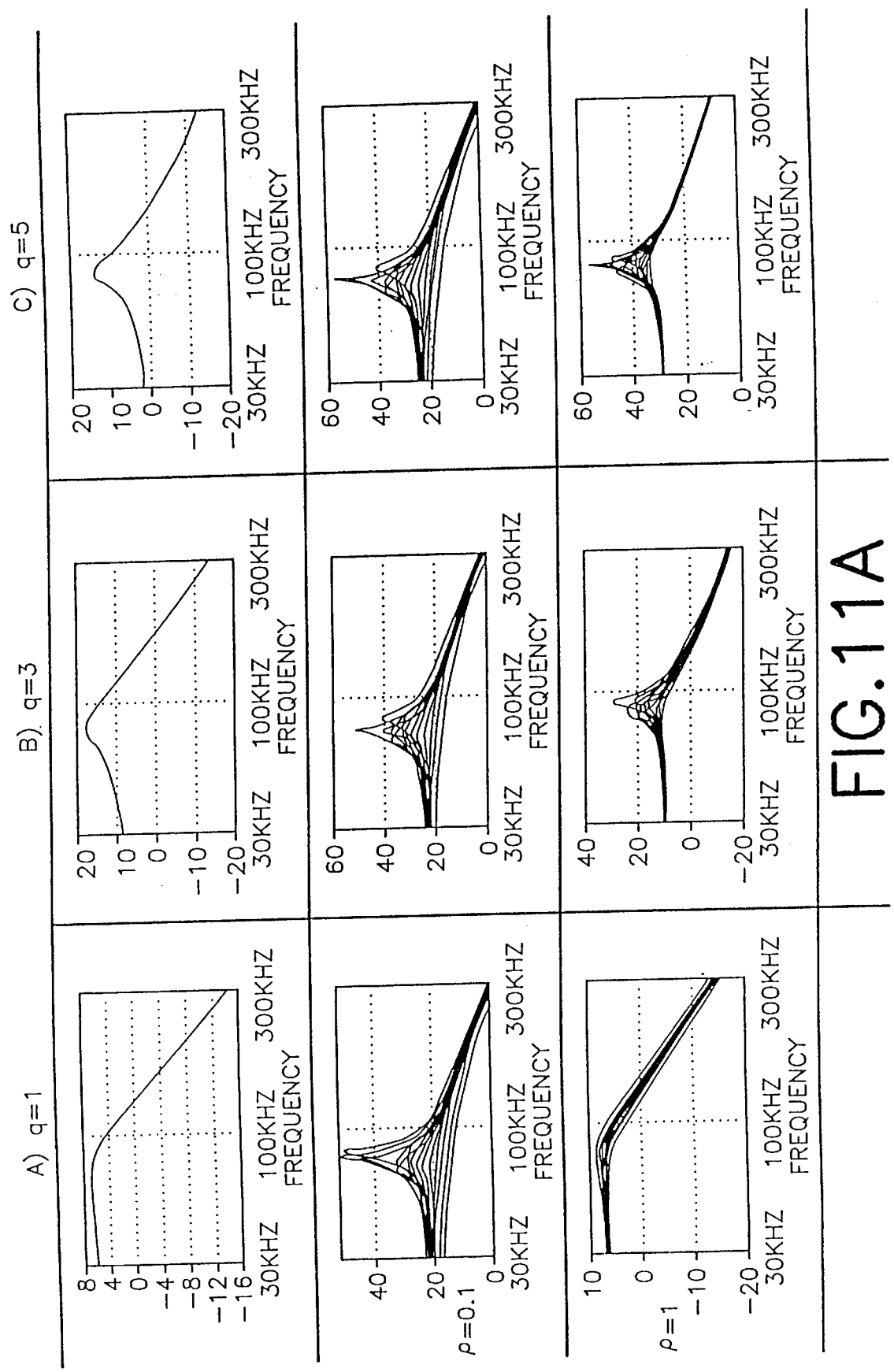
FIG. 11 illustrates amplitude response curves which demonstrate the effect the impedance tapering method of the present invention has on the sensitivity of filters.
Figure 11B:
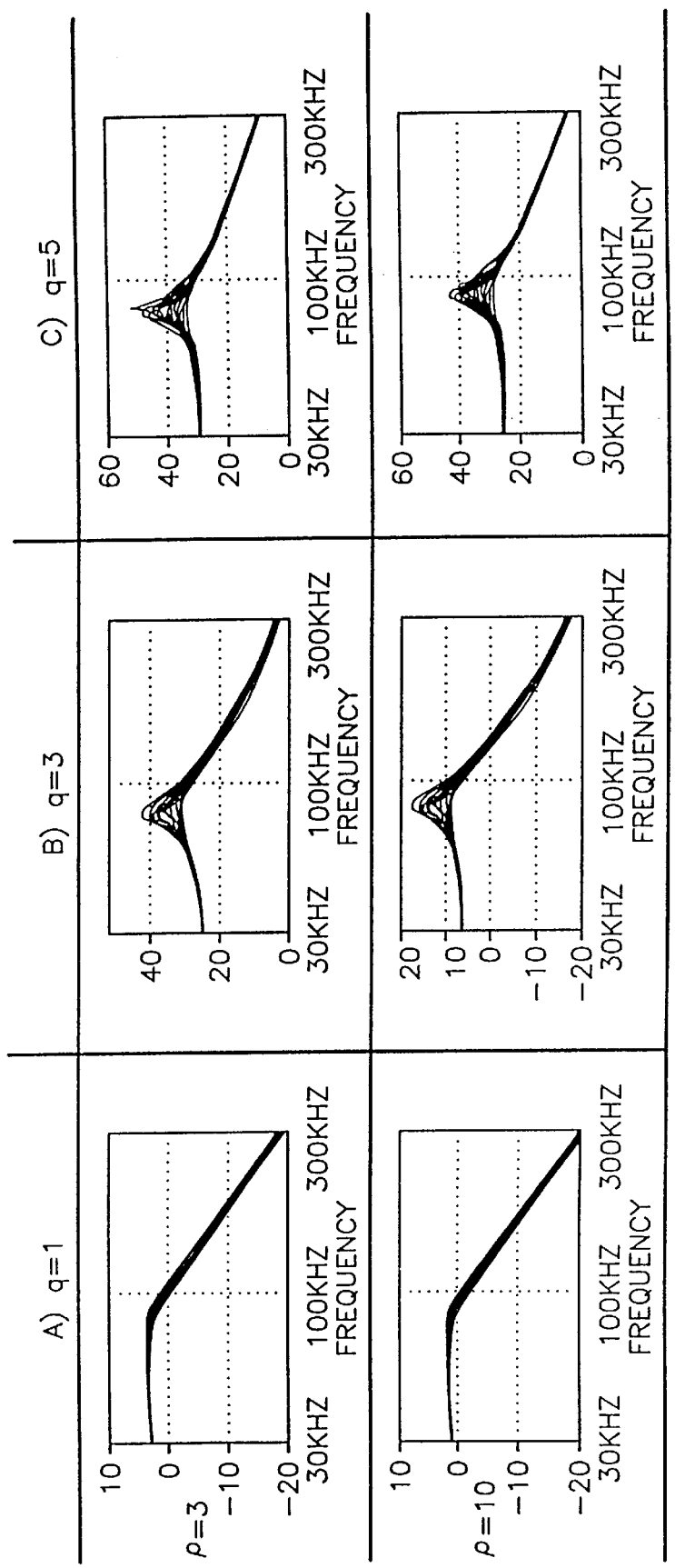

To demonstrate the effect of the impedance tapering method of the present invention, FIG. 11 shows P SPICE Monte Carlo runs of the circuit shown in FIG. 9 for $\rho$ values ranging from 0.1 to 10, and $q_p$ values from 1 to 5. Comparing scenarios a), b) and c) in FIG. 11 for $\rho=r=1$, the influence of the pole Q on component sensitivity for non-impedance scaled circuits is shown. As the pole quality factor is increased, the circuit becomes increasingly sensitive to component variations, which are uniformly distributed with zero mean and 5% tolerance. By impedance scaling by a factor of only 3 (i.e. $\rho=r=3$), the sensitivities are decreased significantly. For p=r=10, the sensitivities are decreased even more. Conversely, when $\rho=r=0.1$, the high sensitivity of the circuits renders them practically useless.

SENSITIVITY EXPRESSIONS FOR THE THIRD ORDER FILTER

Figure 7:
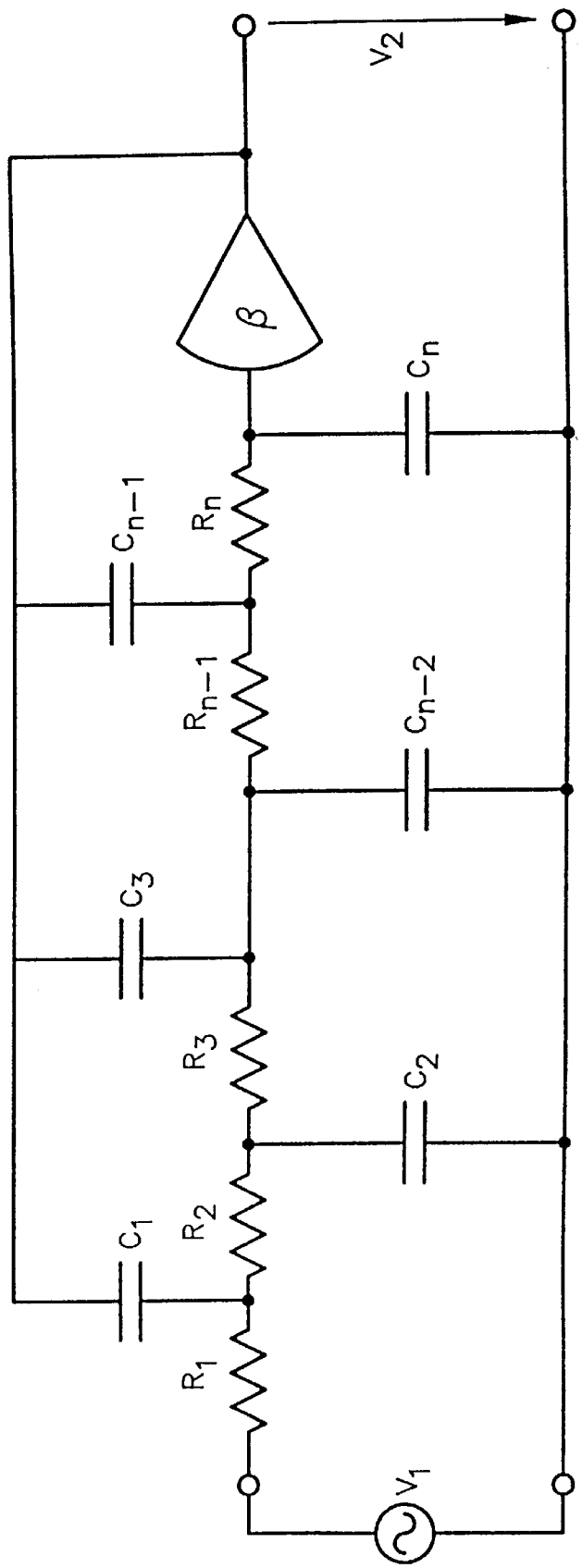
FIG. 7 illustrates an nth-order allpole single-amplifier filter circuit.
Figure 12:
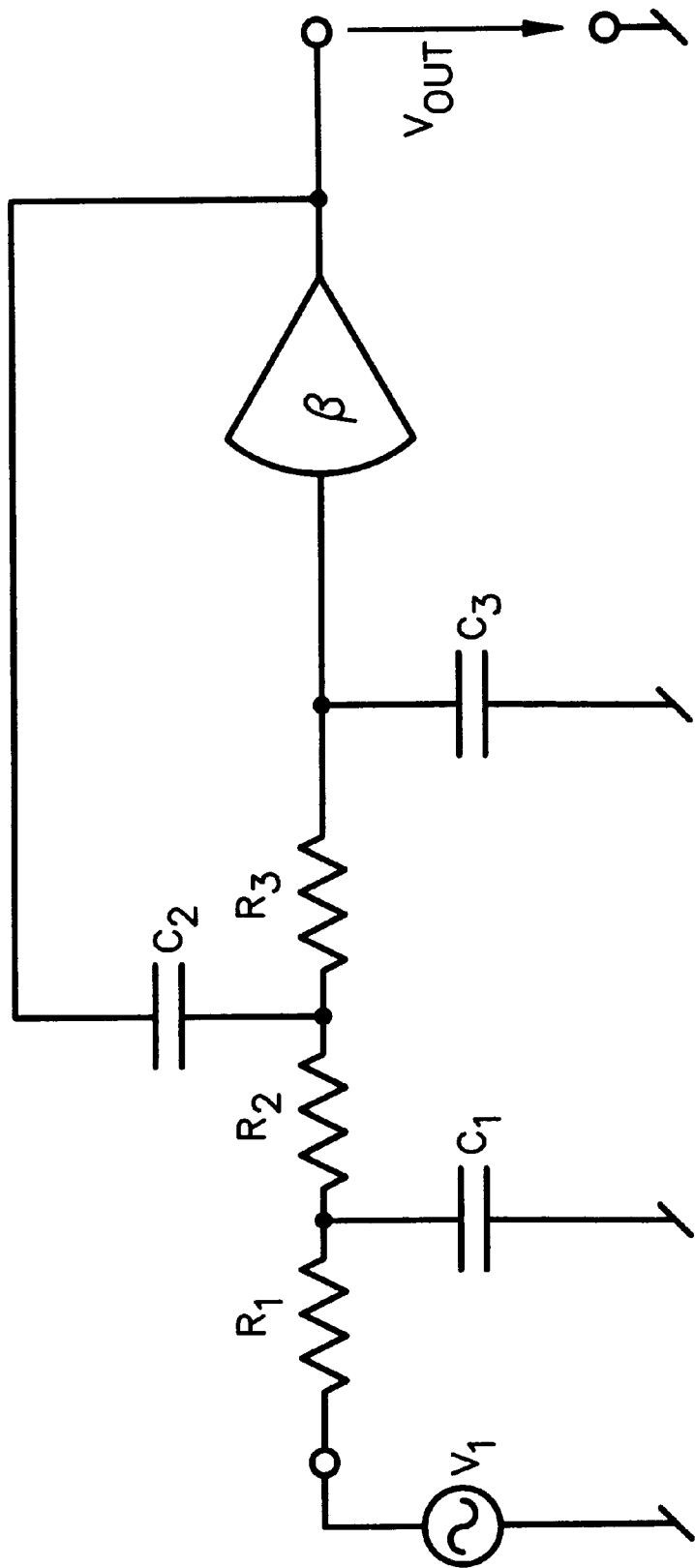
FIG. 12 illustrates a third order lowpass filter circuit.

The third-order version of the nth-order lowpass filter shown in FIG. 7 is shown in FIG. 12. The voltage transfer function is given by:

$$T(s) = \frac{\beta a_0}{s^3 + a_2 s^2 + a_1 s + a_0} \qquad \text{(Eq. 70)}$$

or, in terms of the pole frequencies $\omega_p$, and $\gamma$ the pole Q, $q_p$:

$$T(s) = \frac{\beta \omega_p^2 \gamma}{(s+\gamma)\left(s^2 + \frac{\omega_p}{q_p}s + \omega_p^2\right)} \qquad \text{(Eq. 71)}$$

Note that $\gamma$ is equal to $\omega_p$ for a Butterworth, and to the eccentricity $\epsilon$ times $\omega_p$ for a Chebyshev third-order lowpass filter. The coefficients of T(s) in terms of the circuit components are given by:

$$a_0 = \gamma \omega_p^2 = \frac{1}{R_1 R_2 R_3 C_1 C_2 C_3} \qquad \text{(Eq. 72)}$$

where, in terms of the eccentricity $\epsilon$, $$\gamma = \epsilon \omega_p \quad \text{(Eq. 73)}$$

$$a_1 = \omega_p^2\left(1 + \frac{\epsilon}{q_p}\right) = \frac{R_1(C_1 + C_2 + C_3) + R_2(C_2 + C_3) + R_3C_3 - \beta C_2(R_1 + R_2)}{R_1R_2R_3C_1C_2C_3} \quad \text{(Eq. 74)}$$

$$a_2 = \omega_p\left(\frac{1}{q_p} + \epsilon\right) = \frac{R_1R_2C_1(C_2 + C_3) + R_1R_3C_3(C_1 + C_2) + R_2R_3C_2C_3 - \beta R_1R_2C_1C_2}{R_1R_2R_3C_1C_2C_3} \quad \text{(Eq. 75)}$$

With equation 34 and the sensitivity expressions given by equations 13–19, the following is obtained:

$$\frac{\Delta a_0}{a_0} = \sum_{\mu=1}^{3} S_{R_\mu}^{a_0}\frac{\Delta R_\mu}{R_\mu} + \sum_{\nu=1}^{3} S_{C_\nu}^{a_0}\frac{\Delta C_\nu}{C_\nu} + S_\beta^{a_0}\frac{\Delta\beta}{\beta} \quad \text{(Eq. 76)}$$

$$= -\left(\sum_{\mu=1}^{3}\frac{\Delta R_\mu}{R_\mu} + \sum_{\nu=1}^{3}\frac{\Delta C_\nu}{C_\nu}\right)$$

For the case of a Butterworth filter, where $\gamma=\omega_p$, it follows that $$\frac{\Delta\omega_p}{\omega_p} = \frac{1}{3}\frac{\Delta a_0}{a_0} \quad \text{(Eq. 77)}$$

The variation of $a_1$ and $a_2$ follow from equation 34 as:

$$\frac{\Delta a_i}{a_i} = \sum_{\mu=1}^{3} S_{R_\mu}^{a_i}\frac{\Delta R_\mu}{R_\mu} + \sum_{\nu=1}^{3} S_{C_\nu}^{a_i}\frac{\Delta C_\nu}{C_\nu} + S_\beta^{a_i}\frac{\Delta\beta}{\beta} \quad i=1,2 \quad \text{(Eq. 78)}$$

where:

$$S_{R_1}^{a_1} = \frac{a_0}{a_1}R_1(C_1 + C_2 + C_3 - \beta C_2) - 1 \quad \text{(Eq. 79)}$$

$$= -\frac{a_0}{a_1}R_2C_2\left(1 + \frac{C_3}{C_2} + \frac{R_3C_3}{R_2C_2} - \beta\right)$$

$$S_{R_2}^{a_1} = \frac{a_0}{a_1}R_2(C_2 + C_3 - \beta C_2) - 1 \quad \text{(Eq. 80)}$$

$$= -\frac{a_0}{a_1}R_1C_1\left[1 + \frac{C_2}{C_1}(1-\beta) + \frac{C_3}{C_1}\left(1 + \frac{R_3}{R_1}\right)\right]$$

$$S_{R_3}^{a_1} = \frac{a_0}{a_1}R_1C_3 - 1 \quad \text{(Eq. 81)}$$

$$= -\frac{a_0}{a_1}R_1C_1\left[1 + \left(1 + \frac{R_2}{R_1}\right)\left(\frac{C_2}{C_1}(1-\beta) + \frac{C_3}{C_1}\right)\right]$$

$$S_{C_1}^{a_1} = \frac{a_0}{a_1}R_1C_1 - 1 \quad \text{(Eq. 82)}$$

$$= -\frac{R_1C_1}{a_1}\left[\left(1 + \frac{R_2}{R_1}\right)\frac{C_2(1-\beta) + C_3}{C_1} + \frac{R_3C_3}{R_1C_1}\right]$$

$$S_{C_2}^{a_1} = \frac{a_0}{a_1}R_1C_1C_2(R_1 + R_2)(1-\beta) - 1 \quad \text{(Eq. 83)}$$

$$= -\frac{a_0}{a_1}R_1C_1\left[1 + \frac{C_3}{C_1}\left(1 + \frac{R_2 + R_3}{R_1}\right)\right]$$

$$S_{C_3}^{a_1} = \frac{a_0}{a_1}C_3(R_1 + R_2 + R_3) - 1 \quad \text{(Eq. 84)}$$

$$= -\frac{a_0}{a_1}R_1C_1\left(1 + \frac{R_2}{R_1}\right)\left[\frac{C_2}{C_1}(1-\beta)\right] + 1$$

and $$S_\beta^{a_1} = -\frac{a_0}{a_1}\beta C_2(R_1 + R_2) = -\frac{a_0}{a_1}\beta C_2 R_1\left(1 + \frac{R_2}{R_1}\right) \quad \text{(Eq. 85)}$$

Similarly, the sensitivity of $a_2$ to all the circuit components follows as:

$$S_{R_1}^{a_2} = \frac{a_0}{a_2}R_1[R_2C_1(C_2+C_3) + R_3C_3(C_1+C_2) - \beta R_2C_1C_2] - 1 \quad \text{(Eq. 86)}$$

$$= -\frac{a_0}{a_2}(R_2R_3C_2C_3)$$

$$S_{R_2}^{a_2} = \frac{a_0}{a_2}R_2[R_1C_1(C_2+C_3) + R_3C_2C_3 - \beta R_1C_1C_2] - 1 \quad \text{(Eq. 87)}$$

$$= -\frac{a_0}{a_2}R_1R_3C_3(C_1+C_2)$$

$$S_{R_3}^{a_2} = \frac{a_0}{a_2}R_3C_3[R_1(C_1+C_2) + R_2C_2] - 1 \quad \text{(Eq. 88)}$$

$$= -\frac{a_0}{a_2}R_1R_2C_1[C_2(1-\beta) + C_3]$$

$$S_{C_1}^{a_2} = \frac{a_0}{a_1}R_1C_1[R_2(C_2+C_3) + R_3C_3 - \beta R_2C_2] - 1 \quad \text{(Eq. 89)}$$

$$= -\frac{a_0}{a_2}R_3C_2C_3(R_1+R_2)$$

$$S_{C_2}^{a_2} = \frac{a_0}{a_2}C_2[R_3C_3(R_1+R_2) + R_1R_2C_1(1-\beta)] - 1 \quad \text{(Eq. 90)}$$

$$= -\frac{a_0}{a_2}R_1C_1C_2(R_2R_3)$$

$$S_{C_3}^{a_2} = \frac{a_0}{a_2}C_3[R_1C_1(R_2+R_3) + R_3C_2(R_1+R_2)] - 1 \quad \text{(Eq. 91)}$$

$$= -\frac{a_0}{a_2}R_1R_2C_1C_2(1-\beta)$$

and $$S_\beta^{a_2} = -\frac{a_0}{a_2}\beta R_1R_2C_1C_2 \quad \text{(Eq. 92)}$$

The purpose of deriving the sensitivities above is to examine the fact that they can lead to design guidelines which ensure that the individual coefficient sensitivities will be minimized. It was discussed above with respect to second-order ladder filters that impedance scaling the second L section upwards to decrease the loading on the first L section increases the passive RC pole quality factor, q, towards its absolute, but non-attainable, maximum of 0.5. This decreases not only the $q_p$ sensitivities with respect to variations of the gain $\beta$, but also the coefficient sensitivities with respect to the RC components. For filters of degree higher than two it is no longer practical to derive expressions for individual poles as functions of the components. Thus, in the case of n>3, the closed-form expressions for $\gamma$, $\omega_p$, and $q_p$ as a function of the resistors, capacitors and gain $\beta$ of the circuit, cannot be obtained, nor can an expression for a quality factor related to the passive RC ladder network be obtained. Nevertheless, analytical expressions for the coefficient sensitivity to individual component values, as well as numerical computations, indicate that impedance scaling the ladder network of an nth-order filter, such as that shown in FIG. 7, with a scaling factor ρ>1 reduces the overall sensitivity of the network to all component values.

Figure 13:
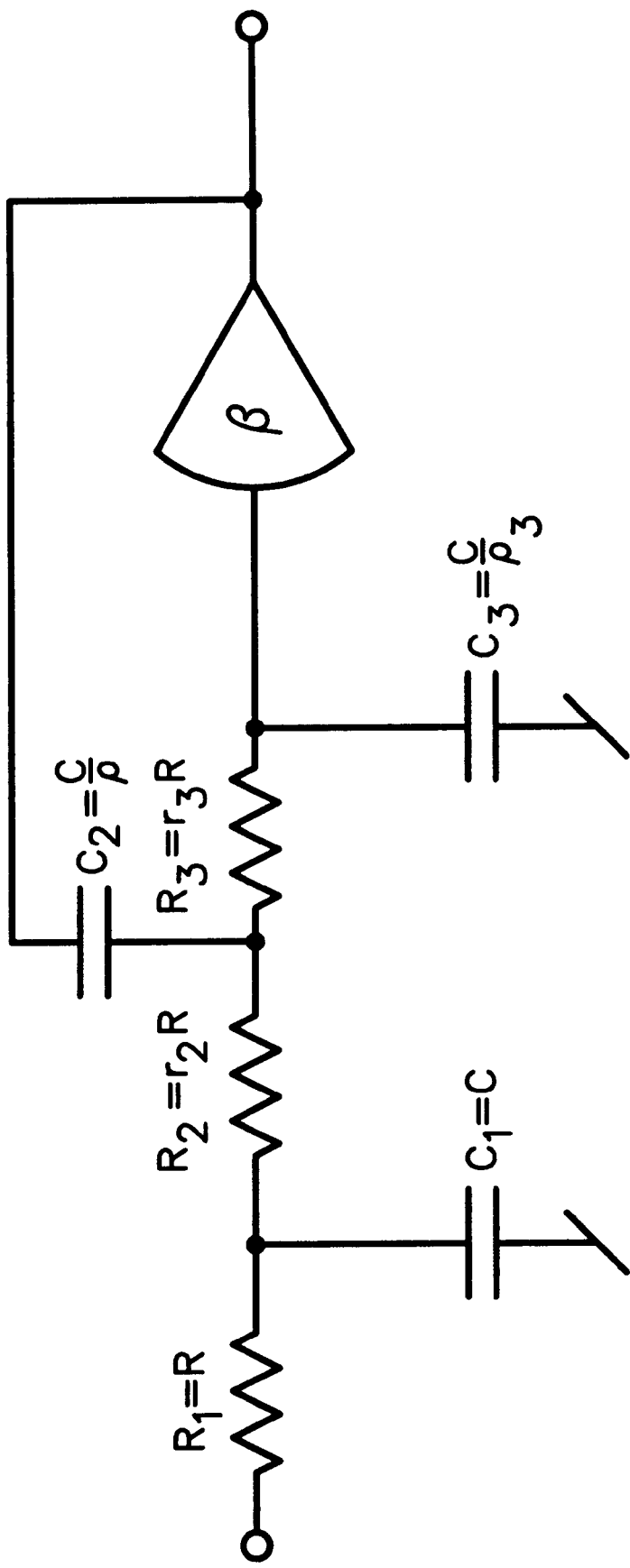
FIG. 13 illustrates the third order lowpass filter circuit of FIG. 12 impedance tapered in accordance with the method of the present invention.

For the third-order network, this results in the circuit shown in FIG. 13, where each resistor $R_i$ is increased from left to right by a factor n, and each capacitor $C_i$ is decreased by a factor $\rho_i^{-1}$. Preferably, $r_1$ is equal to $\rho_i$ for best impedance scaling. However, in order to maintain a sufficient number of degrees of freedom, this condition cannot, in general, be satisfied in the case of the third-order filter. Nevertheless, because the impedance level is being gradually increased, L-section by L-section, from left to right, this process of the present invention shall be referred to herein as network impedance tapering the ladder network, or simply tapering. By tapering in accordance with the present invention, the impedance of the resistors, capacitors, or both, can be increased from left to right.

IMPEDANCE TAPERING THE THIRD ORDER FILTER

Referring to FIG. 13 ideal tapering requires that:

$$r_2 = \rho_2 = \rho$$

$$r_3 \rho_3 = \rho^2 \quad \text{(Eq. 93)}$$

And for the general nth-order network shown in FIG. 7, ideal tapering requires that $$r_i = \rho_i = \rho^{i-1} \quad \text{(Eq. 94)}$$

It will now be shown that the coefficient sensitivities of the third-order network shown in FIG. 13 can be reduced by impedance tapering. By inserting the general impedance scaling factors $r_1$ and $\rho_i$ (as shown in FIG. 13) into the sensitivity expressions given by equations 79-92:

$$R_1 = R; \quad R_2 = r_2 R; \quad R_3 = r_3 R$$

$$C_1 = C; \quad C_2 = C/\rho_2; \quad C_3 = C/\rho_3 \quad \text{(Eq. 95)}$$

the expressions listed in the first column of the tables shown in FIGS. 24 and 25, are obtained. Tapering the resistors separately by $$n = r^{i-1} \quad \text{(Eq. 96)}$$

and the capacitors by $$\rho_i = \rho^{i-1} \quad \text{(Eq. 97)}$$

the sensitivity expressions in column 2 of the two tables of FIGS. 24 and 25 are obtained. Finally, for ideal impedance tapering, the condition of equation 94, which results in the third column of the tables in FIGS. 24 and 25, is obtained.

It can be shown that in general, the coefficient sensitivity of the impedance tapered filter has the form:

$$S_x^{a_i} = -\frac{a_0}{a_i}(RC)^i f(r_\mu, \rho_\nu) \quad \text{(Eq. 98)}$$

where x is any resistor, capacitor or gain element of the circuit. For ideal impedance tapering, (see eq. 94) it follows that:

$$a_0 (RC)^i = 1 \quad \text{(Eq. 99)}$$

and $$S_x^{a_i} = -\frac{f(\rho)}{a_i} \quad \text{(Eq. 100)}$$

Whereas the coefficients $a_i$ are given by the filter specifications, the function f(ρ) can readily be minimized by making ρ>1. Here again, as with the second order filter, a ρ between 2 and 3 will reduce the coefficient sensitivity appreciably. The same applies to the nonideally tapered circuits for which the coefficient sensitivities are given in the first two columns of the tables shown in FIGS. 24 and 25.

In practice, the filter specifications often do not permit ideal impedance tapering, in which case just the capacitors may be tapered with a ρ value of, for example, between 2 and 3, and the resistor values will be determined by the filter design equations. By inspection of the "Separate Impedance Tapering" columns of the tables of FIGS. 24 and 25, it follows that, in order to minimize coefficient sensitivity, the resistor tapering factor should actually be held as small as possible. Typically, the resistor tapering factor should be close to unity, while the capacitor tapering factor ρ should be as large as possible.

Figure 14:
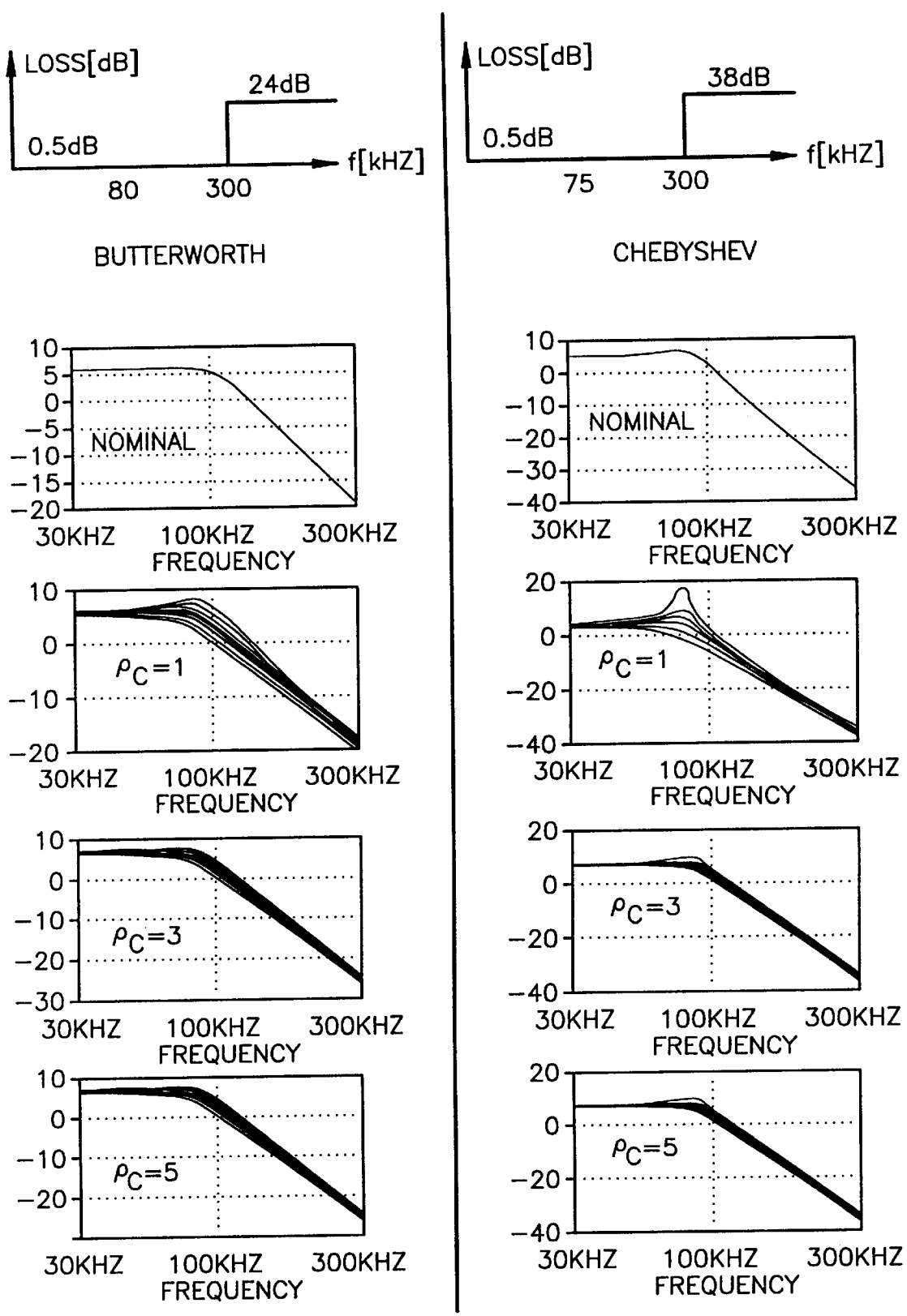
FIG. 14 illustrates amplitude response curves for the third order filter of FIG. 13 which demonstrate the effect the impedance tapering method of the present invention has on a Butterworth filter and a Chebychev filter.

In FIG. 14, the amplitude response curves for third-order Butterworth and Chebyshev filters are shown. The specifications associated with the filters correspond approximately to those defined above in Tables 1 and 2 above, although the pole Qs of the Chebyshev filter are slightly higher (conforming to the stopband attenuation of 38 dB compared to the 25 dB stopband attenuation of Table 2). The capacitor scaling factor $p_c$ was varied from 1 to 5. The resistor scaling factor was determined by the design equations. P SPICE Monte Carlo runs with zero-mean resistors and capacitors and 5% flat distribution were carried out. The response curves of the circuits with tapered capacitors (i.e., $\rho_c=3$ and $\rho_c=5$) are considerably less sensitive to component values than are the non-tapered circuits.

The effect of impendance tapering the nth-order allpole filter of the type shown in FIG. 7 will now be considered. The transfer function is of the form:

$$T(s) = \frac{\beta a_0}{s^n + a_{n-1} s^{n-1} a_{n-2} s^{n-2} + \ldots a_1 s + a_0} \quad \text{(Eq. 101)}$$

or in terms of the individual complex-conjugate pole pairs, for n even $$T(s) = \frac{\beta \prod_{i=1}^{n/2} \omega_{p_i}^2}{\prod_{i=1}^{n/2} \left( s^2 + \frac{\omega_{p_i}}{q_{p_i}} s + \omega_{p_i}^2 \right)} \quad \text{(Eq. 102)}$$

and for n odd $$T(s) = \frac{\beta \gamma \prod_{i=1}^{\frac{n-1}{2}} \omega_{p_i}^2}{\prod_{i=1}^{\frac{n-1}{2}} \left( s^2 + \frac{\omega_{p_i}}{q_{p_i}} s + \omega_{p_i}^2 \right)(s + \gamma)} \quad \text{(Eq. 103)}$$

The relationship between the coefficients in equation 101 and the frequency and Q parameters of equations 102 and 103 are given in the table shown in FIG. 26 for n=2 to 6. For n greater than 3, the analytical computations become increasingly complicated and unwieldy. Furthermore, the nonlinear design equations for a given set of filter specifications and the resulting transfer functions become virtually impossible to solve in most cases for n greater than 3. Nevertheless, assuming the design equations can be solved to determine the R, C and $\beta$ component values for the circuit, some general observations can be made, which coincide closely with the observations made above regarding filters of second and third order. One observation that can be made is that the general expression set forth in equation 98, $$S_x^{a_i} = -\frac{a_0}{a_i}(RC)^j f(r_\mu, \rho_\nu) \qquad \text{(Eq. 104)}$$

continues to hold, as does the expression relating the variation of amplitude response to changes in coefficient values set forth in equation 34:

$$\Delta\alpha(\omega) = \sum_{i=0}^{n} f_i(\omega)\frac{\Delta a_i}{a_i} \qquad \text{(Eq. 105)}$$

The frequency-dependent functions $f_i(\omega)$, discussed above, depend only on the coefficients of the initial transfer function. Examples of these functions, which represent the sensitivity of the transfer function (i.e., of the amplitude and, if desired, phase response) to coefficient variations, were given for n=3 and 6 and plotted in FIGS. 4A–5B. It should be noted that in each case the maxima of the curves lie on either side of and close to the passband edge. It is difficult to deduce from these curves whether the amplitude sensitivity to changes of any one particular coefficient is larger than that of the others, although for the cases depicted in FIGS. 4A–5B, the sensitivity functions $f_i(\omega)$ were seen to increase in the passband and with decreasing i. In any case, the higher the pole Qs of the filter, the larger the individual $f_i(\omega)$ functions will be (i.e., the higher the amplitude sensitivity to coefficient changes, and hence to component changes will be). As has already been emphasized above, pole Qs increase both with increased ripple and with increased filter order. Therefore, the rule of thumb for the design of low amplitude sensitivity filters is to pick a Butterworth filter with the lowest possible order. In practice, however, the trade-off between filter order and passband ripple may nonetheless come out in favor of a Chebyshev filter. This must be investigated individually for each application and filter specification. However, as stated above, the present invention is not limited to these types of filters, as will be apparent to those skilled in the art after reading the present application.

It has been shown above that impedance tapering filters in accordance with the method of the present invention significantly decreases the frequency response sensitivity to component variations. Unfortunately, the tapering factors cannot be arbitrarily chosen because the degrees of freedom inherent in the design equations may not be sufficient to satisfy both the filter specifications and the selected tapering factors. Clearly, tapering factors that are as large as possible are preferable. In practice, however, the tapering factors may be limited by practical design considerations to values lower than about five. Nevertheless, even this much tapering will decrease the filter sensitivity considerably. It should be noted that the tapering factors are not limited by the present invention but are limited only by practical considerations of filter design, with the exception that the tapering factors must be greater than unity.

Having demonstrated that the sensitivity of filters can be minimized by using the impedance tapering method of the present invention, the design equations for tapered second and third-order filters will now be described. Although the equations for higher order-filters defy a satisfactory closed-form solution, in accordance with the present invention, impedance-tapered second and/or third-order filter sections can be cascaded to provide filters of any desired order which have low sensitivity to component values and gain variations.

DESIGN EQUATIONS FOR THE SECOND ORDER FILTER

The design equations of the present invention used for designing a second-order lowpass filter such as that shown in FIG. 8A, for which the transfer function was given in equations 36 and 37 will now be provided. For convenience, the transfer function is repeated here:

$$T(s) = \frac{Ka_0}{s^2 + a_1 s + a_0} \qquad \text{(Eq. 106)}$$

$$= \frac{K \cdot \omega_p^2}{s^2 + \frac{\omega_p}{q_p}s + \omega_p^2}$$

where, instead of the amplifier gain $\beta$, the more general factor K is used, and $$a_0 = \omega_p^2 = \frac{1}{R_1 R_2 C_1 C_2} \qquad \text{(Eq. 107)}$$

and $$a_1 = \frac{\omega_p}{q_p} = \frac{R_1(C_1 + C_2) + R_2 C_2 - \beta R_1 C_1}{R_1 R_2 C_1 C_2} \qquad \text{(Eq. 108)}$$

Referring to FIG. 9 and letting $R_1 = R \quad C_1 = C$ $R_2 = rR \quad C_2 = C/\rho$ (Eq. 109)

and $$\omega_0 = \frac{1}{RC} \qquad \text{(Eq. 110)}$$

This results in $$a_0 = \omega_p^2 = \frac{\rho}{r} = \omega_0^2 \qquad \text{(Eq. 111)}$$

$$a_1 = \frac{\omega_p}{q_p} = \omega_0 \frac{\rho}{r}\left(1 + \frac{1+r}{\rho} - \beta\right) \qquad \text{(Eq. 112)}$$

and $$\beta = 1 + \frac{1+r}{\rho} - \frac{1}{q_p}\sqrt{\frac{r}{\rho}} \qquad \text{(Eq. 113)}$$

In practice K, $a_0$ and $a_1$ or, equivalently, K, $\omega_p$ and $q_p$, will be given by the filter specifications. From these quantities, and possibly some additional constraints, such as input resistance level, maximum or minimum acceptable capacitor values, etc., $\omega_0$, $\rho$, r and $\beta$ are determined, as discussed in more detail below.

From equations 111–113, the following expressions are obtained:

$$r = \frac{\omega_0^2}{(a_1 - \omega_0)\omega_0 + a_0(\beta - 1)} \quad \text{(Eq. 114)}$$

and $$\rho = \frac{ra_0}{\omega_0^2} = \frac{a_0}{(a_1 - \omega_0)\omega_0 + a_0(\beta - 1)} \quad \text{(Eq. 115)}$$

$r$ and $\rho$ must be positive, and $\beta$, which is the gain of a noninverting opamp, must obey the constraint $$\beta \geq 1 \quad \text{(Eq. 116)}$$

Thus, the denominator of equations 114 and 115 must be larger than zero, resulting in the constraint, that $$\omega_0 < \frac{a_1}{2} + \sqrt{\frac{a_1^2}{4} + a_0(\beta - 1)} \quad \text{(Eq. 117)}$$

Because of equation 116, the expression under the square root in equation 117 will always be positive.

METHOD OF THE PRESENT INVENTION FOR DESIGNING SECOND ORDER FILTERS

Using equations 107–117 above, the second-order filter is designed as follows. First, the transfer function coefficients ($a_0$, $a_1$) and the gain ($\beta$) for the filter to be designed are obtained from the filter specifications (e.g., from a filter handbook or CAD program). The value of the filter design radian frequency, $\omega_0$, is then obtained from equation 111 using the value of $a_0$ obtained from the filter specifications. Using equation 114, the value of the resistor tapering factor, $r$, is calculated using the known values of $a_0$, $\omega_0$ and $\beta$. Next, the value of the capacitor tapering factor, $\rho$, is calculated using equation 111 and the known values of $\omega_0$, $r$ and $a_0$. Alternatively, the capacitor tapering factor, $\rho$, can be calculated using equation 115 and the known values of $a_0$, $\omega$ and $\beta$ and the value of resistive tapering factor, $r$, can be calculated using equation 111.

Once these values have been calculated, either $R_1$ or $C_1$ is selected in accordance with practical design considerations, which are understood by those of ordinary skill in the art. If the value of $R_1$ is selected, the value of $C_1$ is calculated using equation 110. The values for $R_2$ and $C_2$ are then obtained using equation 109. Alternatively, the value for $C_1$ can be selected and then the values of $R_1$, $R_2$ and $C_2$ are calculated using equations 110 and 109, respectively.

DESIGN EQUATIONS FOR THE THIRD ORDER FILTER

The mathematical design equations of the present invention for designing a third-order filter with low sensitivity to component values will now be described with reference to the third-order lowpass filter shown in FIG. 12. The transfer function, as given by equation 70 is repeated here for convenience:

$$T(s) = \frac{Ka_0}{s^3 + a_2 s^2 + a_1 s + a_0} = \frac{K\omega_p^2 \gamma}{(s + \gamma)\left(s^2 + \frac{\omega_p}{q_p}s + \omega_p^2\right)} \quad \text{(Eq. 118)}$$

where the more general notation for the gain, K, is used rather than the amplifier gain $\beta$, and $$a_0 = \gamma \omega_p^2 = \frac{1}{R_1 R_2 R_3 C_1 C_2 C_3} \quad \text{(Eq. 119)}$$

$$a_1 = \omega_p^2\left(1 + \frac{\gamma}{q_p}\right) = \frac{R_1(C_1 + C_2 + C_3) + R_2(C_2 + C_3) + R_3 C_3 - \beta C_2(R_1 + R_2)}{R_1 R_2 R_3 C_1 C_2 C_3} \quad \text{(Eq. 120)}$$

$$a_2 = \omega_p\left(\frac{1}{q_p} + \gamma\right) = \frac{R_1 R_2 C_1(C_2 + C_3) + R_1 R_3 C_3(C_1 + C_2) + R_2 R_3 C_2 C_3 - \beta R_1 R_2 C_1 C_2}{R_1 R_2 R_3 C_1 C_2 C_3} \quad \text{(Eq. 121)}$$

Referring to FIG. 13:

$$\begin{aligned} R_1 &= R & C_1 &= C \\ R_2 &= r_2 R & C_2 &= C/\rho_2 \\ R_3 &= r_3 R & C_3 &= C/\rho_3 \end{aligned} \quad \text{(Eq. 122)}$$

and $$\omega_0 = \frac{1}{RC} \quad \text{(Eq. 123)}$$

In what follows it will be shown that $\omega_0$ is an important design parameter, the value of which determines the realizability of a third-order filter.

With equations 119 and 121, the following relations between the transfer-function coefficients, tapering factors, design frequency $\omega_0$, and gain are obtained:

$$a_0 = \omega_0^3 \cdot \frac{\rho_2 \rho_3}{r_2 r_3} \quad \text{(Eq. 124)}$$

$$a_1 = \omega_0^2 \frac{\rho_2 \rho_3}{r_2 r_3}\left[\left(1 + \frac{1}{\rho_2} + \frac{1}{\rho_3}\right) + r_2\left(\frac{1}{\rho_2} + \frac{1}{\rho_3}\right) + \frac{r_3}{\rho_3} - \beta\frac{(1 + r_2)}{\rho_2}\right] \quad \text{(Eq. 125)}$$

$$a_2 = \omega_0 \frac{\rho_2 \rho_3}{r_2 r_3}\left[r_2\left(\frac{1}{\rho_2} + \frac{1}{\rho_3}\right) + \frac{r_3}{\rho_3}\left(1 + \frac{1}{\rho_2}\right) + \frac{r_2 r_3}{\rho_2 \rho_3} - \beta\frac{r_2}{\rho_2}\right] \quad \text{(Eq. 126)}$$

Before discussing the ideal impedance tapering case, i.e., the case for which $r_2=\rho$, $r_3=\rho^2$, $\rho_2=\rho$, and $\rho_3=\rho^2$, the general case in which R, C, $\rho_1$, $\rho_2$, $a_0$, $a_1$, $a_2$ and K are given, and $r_2$, $r_3$ and $\beta$ are found will be discussed. It is useful (but not required) to normalize the coefficients $a_i$ with respect to $\omega_0 = (RC)^{-1}$, thus:

$$\alpha_0 = \frac{a_0}{\omega_0^3}; \quad \alpha_1 = \frac{a_1}{\omega_0^2}; \quad \alpha_2 = \frac{a_2}{\omega_0} \tag{Eq. 127}$$

and in general $$\alpha_i = \frac{a_i}{\omega_0^{n-i}} \quad i = 0, 1, \cdots n-1 \tag{Eq. 128}$$

and n is the order of the filter transfer function T(s). After some calculation, the following three equations for the unknown quantities are obtained:

$$ar_2^2 + br_2 + c = 0 \tag{Eq. 129}$$

where $$a = \alpha_0 + \alpha_2 - \alpha_1 - 1 \tag{Eq. 130}$$

$$b = \alpha_2 - 2 \tag{Eq. 131}$$

$$c = -(1 + \rho_2) \tag{Eq. 132}$$

for $r_3$:

$$r_3 = \frac{\rho_2 \rho_3}{r_2 \alpha_0} \tag{Eq. 133}$$

and for $\beta$:

$$\beta = 1 + \frac{\rho_2}{\rho_3} - \frac{r_3}{\rho_3}\left[(\alpha_2 - 1) - \frac{1 - \rho_2}{r_2}\right] \tag{Eq. 134}$$

Since $r_2$ must be positive and real it follows that the discriminant D of the quadratic equation (equation 129) must be greater than zero, thus:

$$D = b^2 - 4ac = (\alpha_2 - 2)^2 + 4(\alpha_0 + \alpha_2 - \alpha_1 - 1)(1 + \rho_2) > 0 \tag{Eq. 135}$$

The necessary and sufficient condition for $r_2$ to be real and positive results from equation 135 in the form of an upper bound on $\omega_0$. In terms of the transfer function coefficients $a_i$, i=0, 1, 2, the following expression is obtained:

$$\frac{1}{RC} = \omega_0 < \omega_{0\,max} \tag{Eq. 136}$$

where $$\omega_{0\,max} = \frac{4a_0}{4a_1 - a_2^2} \tag{Eq. 137}$$

Moreover, a realizability condition on the product $(r_2 r_3)$ is shown to also depend on $\omega_{0\,max}$, namely:

$$\frac{r_2 r_3}{\rho_2 \rho_3} < \frac{\omega_{0\,max}^3}{a_0} \tag{Eq. 138}$$

This condition implies that for ideal impedance tapering, in which case $r_2 r_3 = \rho_2 \rho_3$, the following condition must be satisfied:

$$\frac{\omega_{0\,max}^3}{a_0} > 1 \tag{Eq. 139}$$

Whether this condition can be fulfilled depends entirely on the coefficients $a_i$ of the specified filter.

Finally, bounds guaranteeing that $r_2$ be both real and positive, and that the gain $\beta$ be larger than or equal to unity, are defined by the expression:

$$\frac{r_2}{1+\rho_2}\left[\frac{\alpha_2 - 1}{r_2 \alpha_0} - \frac{1}{\rho_3}\right] < r_3 < \frac{1}{r_2 \alpha_0} \tag{Eq. 140}$$

where it is understood that the $\omega_0$ contained in $\alpha_0$ and $\alpha_2$ obeys the inequality in equation 136.

METHOD OF THE PRESENT INVENTION FOR DESIGNING THIRD ORDER FILTERS

Figure 15:
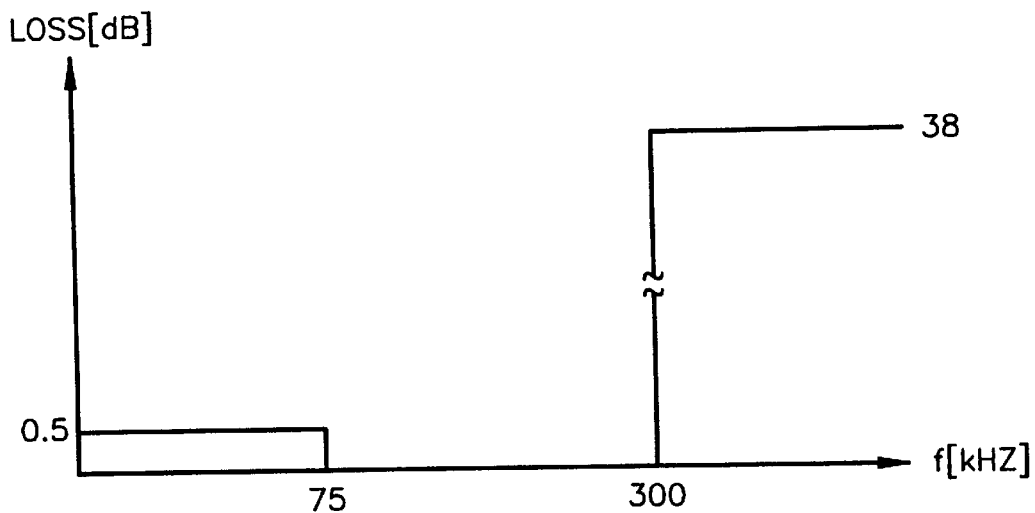
FIG. 15 illustrates the loss specifications for a lowpass Chebychev filter.

Several examples of the application of the method of the present invention for designing a third order filter in accordance with the design equations set forth above will now be described. Consider the specified amplitude response of a third-order Chebyshev lowpass filter shown in FIG. 15. This is the same as the amplitude response of the Chebyshev lowpass filter shown in FIG. 14. The coefficients of the third-order transfer function (see eq. 118) satisfying these specifications are:

$$a_0 = 0.749 \times 10^{17}$$

$$a_1 = 0.341 \times 10^{12}$$

$$a_2 = 0.59 \times 10^6 \tag{Eq. 141}$$

The corresponding dc gain and pole parameters are:

$$K = 2$$

$$\omega_p = 0.5037 \times 10^6$$

$$q_p = 1.7$$

$$\alpha = 0.295 \times 10_6 \tag{Eq. 142}$$

and the maximum design frequency $\omega_{0\,max}$ is:

$$\omega_{0\,max} = \frac{4a_0}{4a_1 - a_2^2} = 294.91 \cdot 10^3 \, \text{rad.}/S \tag{Eq. 143}$$

Note that $$\frac{\omega_{0\,max}^3}{a_0} = \frac{25.65}{74.9} = 0.342 \tag{Eq. 144}$$

Thus, from equation 139 it is clear that for the filter given by the coefficients in equation 141, ideal impedance tapering is not possible. This is because ideal impedance tapering would require that $r_2 r_3 = \rho_2 \rho_3$ in which case, according to equation 139, $(\omega_{0\,max})^3/a_0$ would have to be larger than unity, which it clearly is not.

The step-by-step design procedure of the present invention for designing the third-order Chebyshev lowpass filter satisfying the specifications given above will now be provided while, at the same time, obeying different types of impedance tapering criteria.

A. IMPEDANCE TAPERING ONLY WITH RESPECT TO THE CAPACITORS

For a capacitively-impedance tapered filter, the step-by-step design is as follows:

1. Calculate $\omega_{0\,max}$

From equations 137 and 141, the following is obtained:

$$\omega_{0\,max} = \frac{4(0.0749) \cdot 10^{18}}{4(0.341 \cdot 10^{12}) - (0.59)^2 \cdot 10^{12}}$$

$$= 2.9491 \cdot 10^5 \text{ rad/sec.}$$

2. Select $\rho_2$, $\rho_3$, $\omega_0$

The selection of these values is influenced by the upper bound discussed above:

$$\frac{r_2 r_3}{\rho_2 \rho_3} < \frac{\omega_{0\,max}^3}{a_0} = 0.342$$

Letting $\rho_2 = 3$ and $\rho_3 = 9$ it follows that:

$$r_2 r_3 < \frac{\omega_{0\,max}^3}{a_0} \rho_2 \rho_3 = \frac{0.2565}{0.749} 27 = 9.246$$

For practical design reasons, which will be understood by persons of ordinary skill in the art, $\omega_0$ is chosen as $\omega_0 = 1.916 \times 10^5$.

3. Calculate $\alpha_0$, $\alpha_1$ and $\alpha_2$ and a, b and c of equation 129. With $\omega_0 = 1.916 \times 10^5$ the following is obtained:

$$\alpha_0 = \frac{a_0}{\omega_0^3} = \frac{74.9 \cdot 10^{15}}{(1.916)^3 \cdot 10^{15}} = 10.649$$

$$\alpha_1 = \frac{a_1}{\omega_0^2} = \frac{34.1 \cdot 10^{10}}{(1.916)^2 \cdot 10^{10}} = 9.289$$

$$\alpha_2 = \frac{a_2}{\omega_0} = \frac{5.9 \cdot 10^5}{1.916 \cdot 10^5} = 3.079$$

and therefore:

$$a = \alpha_0 + \alpha_2 - \alpha_1 - 1 = 3.439$$

$$b = a - 2 = 1.079$$

$$c = -1 - \rho_2 = -4$$

4. Calculate $r_2$ and $r_3$:

By solving the quadratic of equation 129 for $r_2$, the value of $r_2$ is obtained as:

$$r_2 = 0.933$$

From equation 133, $$r_2 r_3 = \frac{\rho_2 \rho_3}{\alpha_0} = \frac{27}{10.649} = 2.535$$

the value of $r_3$ is determined as $$r_3 = 2.718$$

5. Select $C_1$ and compute $R_1$, $R_2$ and $R_3$

The value of $C_1$ is selected as $C_1 = 900$ pF, thus $$R_1 = \frac{1}{\omega_0 \cdot C_1} = \frac{1}{1.916 \cdot 10^5 \cdot 9 \cdot 10^{10}} = 5.799 \text{k}\Omega$$

and:

$$R_2 = r_2 R_1 = 5.41 \text{ k}\Omega$$

6. Compute $\beta = K$:

From equation 134, the value of $\beta$ is obtained:

$$\beta = 1 + \frac{\rho_2}{\frac{\rho_3}{1.33}} - \frac{r_3}{\rho_3}\left[\left(\alpha_2 - 1\atop 2.079\right) - \frac{1 + \rho_2}{\frac{r_2}{\frac{4}{0.933}}}\right] = 1.999 \approx 2$$

Figure 16:
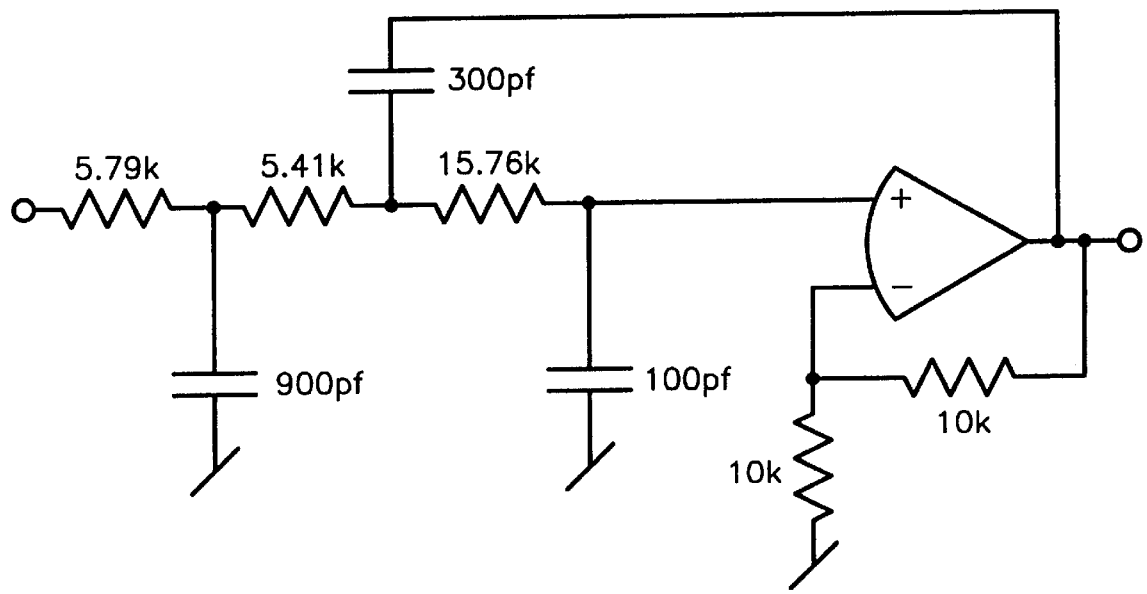
FIG. 16 illustrates a third order lowpass Chebychev filter which has been impedance tapered in accordance with the method of the present invention.

The resulting circuit is shown in FIG. 16. A simple first-order check for the correctness of these values can be obtained using equation 119 to verify that:

$$a_0 = \frac{1}{R_1 R_2 R_3 C_1 C_2 C_3} \quad \text{(Eq. 145)}$$

and that the obtained gain:

$$\beta = K$$

This is readily verified for the circuit of FIG. 16.

The values for the Butterworth filters whose responses are shown in FIG. 14 are given in the table of FIG. 27. The transfer-function coefficients for this filter are:

$$a_0 = 3.64 \times 10^{17}$$

$$a_1 = 1.02 \times 10^2$$

$$a_2 = 1.43 \times 10^6 \quad \text{(Eq. 146)}$$

The upper limit on $\omega_0$ is:

$$\omega_{0\,max} = \frac{4 a_0}{4 a_1 - a_2^2} = 7.154 \cdot 10^5 \quad \text{(Eq. 147)}$$

The design values are obtained in the same step-by-step procedure discussed above for the Chebyshev filters. Therefore, the design procedure will not be repeated here for the Butterworth filter. The effectiveness of impedance tapering the capacitors of the Chebyshev and Butterworth filters in order to reduce the sensitivity to component values is demonstrated in FIG. 14.

Figure 17:
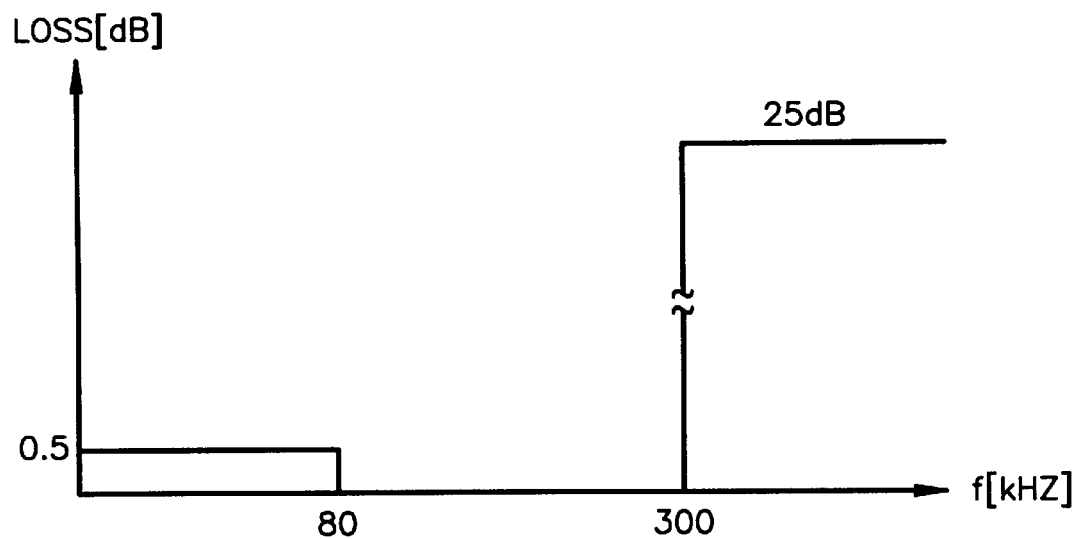
FIG. 17 illustrates the loss specifications for a third order lowpass Butterworth filter.
Figure 18:
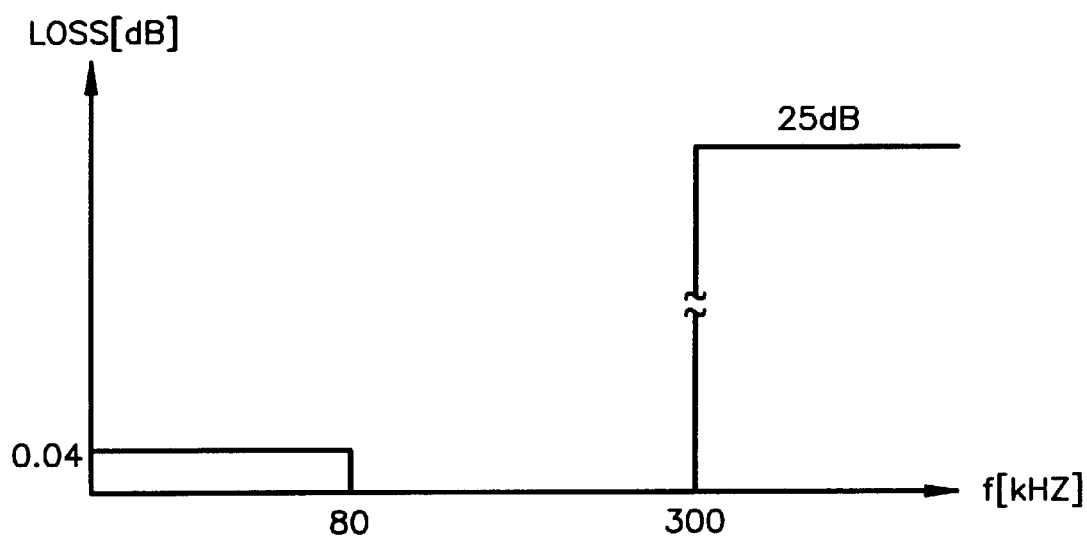
FIG. 18 illustrates the loss specifications for a third order lowpass Chebychev filter.

The preceding examples demonstrate impedance tapering of the capacitors by starting out with values of $\rho_c$ (i.e., $\rho_2$ and $\rho_3$ in FIG. 13) and then calculating the resistor values by computing $r_2$ and $r_3$. These depend on the choice of the design frequency $\omega_0 = (R_1 C_1)^{-1}$ which must always be smaller than $\omega_{0\,max}$. The latter depends on the desired filter transfer function and its coefficients. As was pointed out earlier, impedance tapering of both the capacitors and the resistors for filters of higher than second order is possible only in rare cases, since the degrees of freedom necessary to satisfy a given set of filter specifications usually permit tapering of only the capacitors or the resistors. As shown in the preceding examples, however, impedance tapering of only the capacitors provides a significant reduction in sensitivity to component values. It shall now be shown that the alternative procedure, i.e., tapering of only the resistors, is effective in the same way. To show this, the Butterworth filter discussed above, whose transfer-function coefficients are given by equation 146 and whose response for various capacitive-impedance tapering values were given in FIG. 14, will be used for purposes of illustration. The amplitude-response specifications are shown in FIG. 17. For this example, a value of K=4 is selected.

B. IMPEDANCE TAPERING ONLY WITH RESPECT TO THE RESISTORS

1. Calculate $\omega_{0\ max}$

Since the filter is being designed in accordance with the coefficients stated in equation 146, $\omega_{0\ max}$ is given by equation 147 as $\omega_{0\ max}=7.1544\times10^5$.

2. Select $r_2$, $r_3$ and $\omega_0$

The selection of these values is influenced by the upper bound:

$$\frac{r_2 r_3}{\rho_2 \rho_3} < \frac{\omega_{0\ max}^3}{a_0} = 1.006 \qquad \text{(Eq. 148)}$$

Letting $r_2=3$ and $r_3=9$, the product of $\rho_2$ and $\rho_3$ is calculated as:

$$\rho_2 \rho_3 > \frac{27}{1.006} \approx 27 \qquad \text{(Eq. 149)}$$

In accordance with practical design considerations, (in terms of component values) $\omega_0$ is selected to be $$\omega_0 = (R_1 C_1)^{-1} = 4.695\times10^5 \qquad \text{(Eq. 150)}$$

3. Calculate $\alpha_0$, $\alpha_1$ and $\alpha_2$ and a, b and c of equation 129 using equation 150, the following values are obtained:

$\alpha_0 = 3.5176$ $\alpha_1 = 4.6276$ $\alpha_2 = 3.046 \qquad \text{(Eq. 151)}$ and therefore $a = \alpha_0 + \alpha_2 - \alpha_1 - 1 = 0.936$ $b = \alpha_2 - 2 = 1.046$ $c = -1 - \rho_2 \qquad \text{(Eq. 152)}$ 4. Calculate $\rho_2$ and $\rho_3$:

Solving equations 129 and 152 for $\rho_2$ the following equation is obtained:

$$\rho_2 = a r_2^2 + b r_2 - 1 \qquad \text{(Eq. 153)}$$

which is a first-order equation which must be solved for capacitance tapering. With the values in equation 152, $\rho_2$ is obtained as:

$\rho_2 = 10.562 \qquad \text{(Eq. 154)}$ and with equation 133:

$$\rho_3 = \frac{r_2 r_3}{\rho_2} \cdot a_0 = 8.99 \qquad \text{(Eq. 155)}$$

Note that the condition set forth in equation 149 is automatically satisfied if $\omega_0 < \omega_{0\ max}$.

5. Select $R_1$ in accordance with practical design considerations and compute $C_1$, $C_2$ and $C_3$ Select $R_1 = 10$ k$\Omega$, thus $$C_1 = \frac{1}{\omega_0 R_1} = \frac{1}{4.695 \cdot 10^5 \cdot 10^4} = 213 \text{ pF}. \qquad \text{(Eq. 156)}$$

and with equations 154 and 155:

$$C_2 = \frac{C_1}{\rho_2} = 20.1 \text{ pF} \qquad \text{(Eq. 157)}$$

and $$C_3 = \frac{C_1}{\rho_3} = 23.7 \text{ pF} \qquad \text{(Eq. 158)}$$

6. Compute $\beta = K$:

$$\beta = 1 + \frac{\rho_2}{\rho_3} - \frac{r_3}{\rho_3}\left[(\alpha_2 - 1) - \frac{1+\rho_2}{r_2}\right] = 3.98 \approx 4 \qquad \text{(Eq. 159)}$$

Figure 19:
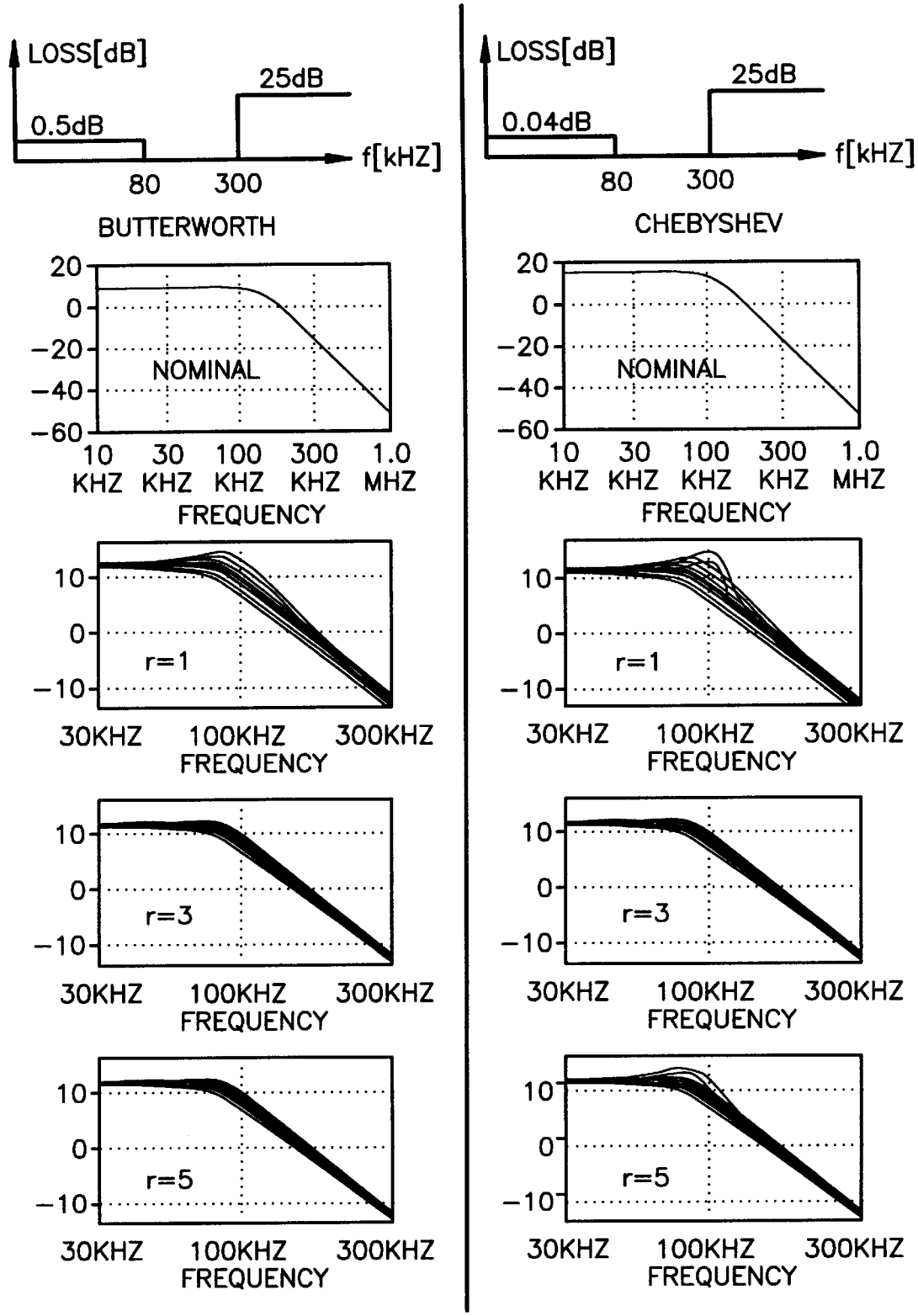
FIG. 19 illustrates frequency response curves for the Butterworth and Chebychev filters having the loss specifications shown in FIGS. 17 and 18, respectively, which demonstrate the effect of impedance tapering only the resistors of the circuit.

Following this procedure with three representative resistive tapering factors, the three Butterworth filters defined by the values listed in the table of FIG. 28 were obtained. Similarly, for the filter characteristics depicted in FIG. 17 the Chebyshev filter coefficients were obtained:

$a_0 = 3.30\times10^{17}$ $a_1 = 0.91\times10^{12}$ $a_2 = 1.2\times10^6$ $K = 4 \qquad \text{(Eq. 160)}$ The corresponding filter parameters are also listed in the table of FIG. 28. It can be seen from FIG. 28 that $r_2 = r$ and $r_3 = r^2$. The corresponding Monte Carlo runs for 5% component values are shown in FIG. 19. Comparing the reduction in sensitivity to component values for capacitive and resistive impedance tapering, i.e., comparing FIG. 14 with 19, it is evident that both are useful for the design of tolerance-insensitive filter circuits, although tapering only the capacitors (FIG. 14) may be slightly more effective than tapering only the resistors (FIG. 19). The Chebyshev curves in FIG. 19 deteriorate somewhat for $r=5$ compared to those for $r=3$. The reason for this is further discussed below.

It has been shown above that in order to find a realizable third-order filter circuit capable of satisfying given filter requirements, the condition $\omega_0 = (R_1 C_1)^{-1} < \omega_{0\ max}$ must be satisfied where $\omega_{0\ max}$ is given in terms of the filter coefficients as in equation 137. The influence the choice of $\omega_0$ has on the filter design, assuming of course that it is chosen less than $\omega_{0\ max}$, will now be investigated.

To determine the amount of influence the choice of $\omega_0$ has on the component sensitivity of a given circuit, the following procedure of the present invention must be followed. Using the coefficients of equation 141 (which belong to the third-order transfer function satisfying the filter specifications in FIG. 15) as an illustrative example, the procedure can be summarized by the following steps:

1. Select $\rho_2$, $\rho_3$ and $\omega_0 < \omega_{0\ max}$

Example: for the coefficients of equation 141, $\omega_{0\ max} = 2.9491\times10^5$ rad/sec.

Select $\rho_2 = 3$, $\rho_3 = 9$, $\omega_0 = 1.25\times10^5$

2. Calculate $\alpha_0$, $\alpha_1$, $\alpha_2$, and a, b, and c $\alpha_0 = a_0/\omega^3 = 38.3488$; $\alpha_1 = 21.824$; $\alpha_2 = 4.72$ $a = \alpha_0 + \alpha_2 - \alpha_1 - 1 = 20.2448$ $$b = a_2 - 2 = 2.72$$

$$c = -\rho_2 - 1 = -4$$

3. Calculate $r_2$ and $r_3$
   From equations 129–132, the following is obtained:

$$20.2448 r_2^2 + 2.72 r_2 - 4 = 0$$

which gives the positive real root $$r_2 = 0.3824$$

and with equation 133:

$$r_2 = \rho_2 \rho_3 / r_2 \alpha_0 = 1.84$$

4. Select $C_1$ and calculate $R_1$, $R_2$, $R_3$, $C_2$, $C_3$
   Selecting $C_1 = 900$ pF
   Thus $$R_1 = 1/\omega_0 C_1 = 8.88 \text{ k}\Omega$$

and $$R_2 = r_2 R_1 = 3.4 \text{ k}\Omega$$

$$R_3 = r_3 R_1 = 16.36 \text{ k}\Omega$$

$$C_2 = C_1 / \rho_2 = 300 \text{ pF}$$

$$C_3 = C_1 / \rho_3 = 100 \text{ pF}$$

These results can be verified to a first order (see equation 145) since $$a_0 = \frac{1}{R_1 R_2 R_3 C_1 C_2 C_3} = 74.9 \cdot 10^{15} \quad \text{(Eq. 161)}$$

5. Calculate $\ominus = K$ as follows:

$$\beta = 1 + \frac{\rho_2}{\rho_3} - \frac{\rho_2}{\frac{\alpha_0 r_2}{\frac{r_3}{r_3}}} \left[ \alpha_2 - 1 - \frac{(1+\rho_2)}{r_2} \right] = 2.712 \quad \text{(Eq. 162)}$$

Figure 20:
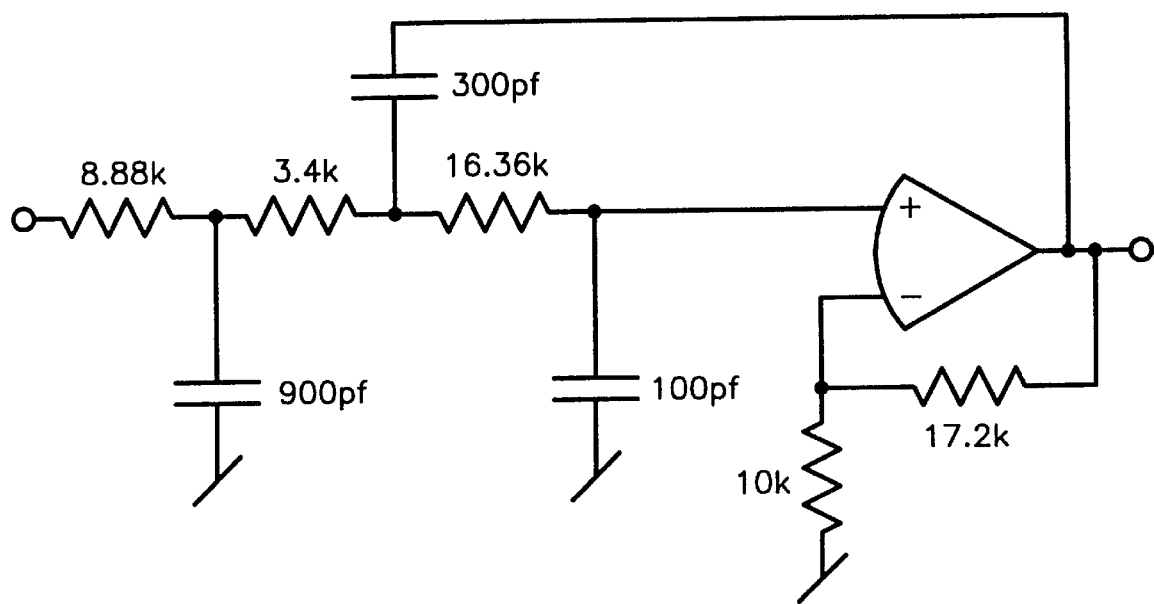
FIG. 20 illustrates a third order filter which has been impedance tapered in accordance with the method of the present invention.

This results in the circuit shown in FIG. 20.

Figure 21:
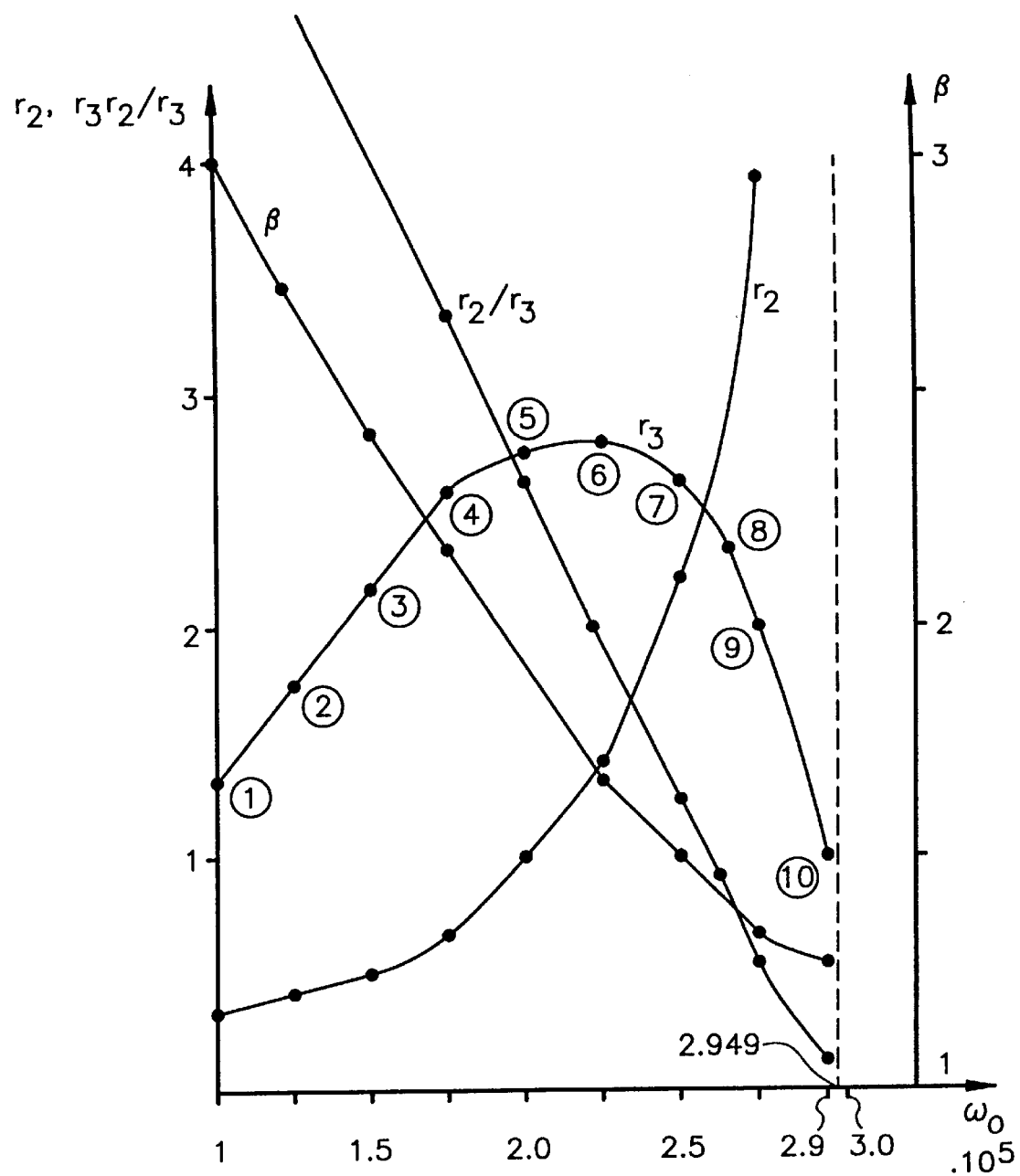
FIG. 21 illustrates functions of the tapering factors verses design frequency.
Figure 22:
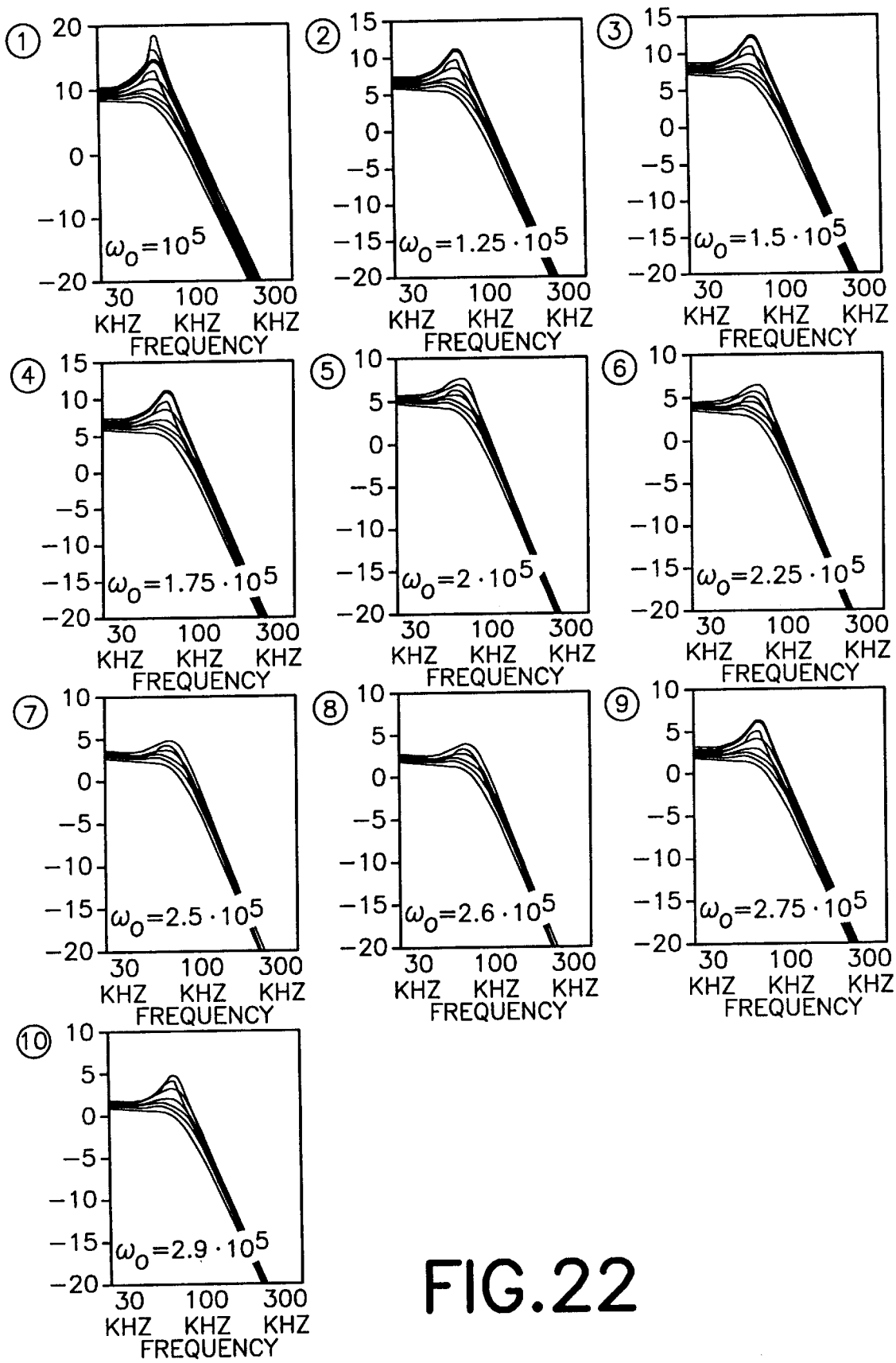
FIG. 22 illustrates amplitude response curves for impedance tapered third order filters which demonstrate the effect the design frequency has on the filter sensitivity.

Going through the five design steps above for 10 different values of $\omega_0$ (all of which must, of course, be less than $\omega_{0\ max}$), 10 different third-order circuits were determined by the design values listed in the table of FIG. 29. The resulting functions of $r_2$, $r_3$, $r_3/r_2$ and $\beta$ vs. the ten values of $\omega_0$ are plotted in FIG. 21. Monte Carlo runs of the 10 resulting third-order lowpass filters for 5% resistors and capacitors are shown in FIG. 22. It should be noted that the tolerances of the filter responses in FIG. 22 become smallest for the value of $\omega_0$ in the region of $26 \times 10^5$. A glance at FIG. 21 shows that this corresponds to a ratio of $r_3/r_2 \approx 1$, i.e., for the case of $r_2 = r_3$. This is similar to the conclusion arrived at with second-order networks. Thus, it is preferable to select a value of $\omega_0$ for which $r_2 = r_3$.

C. IMPEDANCE TAPERING THE CAPACITORS WITH $r_2 \approx r_3 = r$

Figure 23:
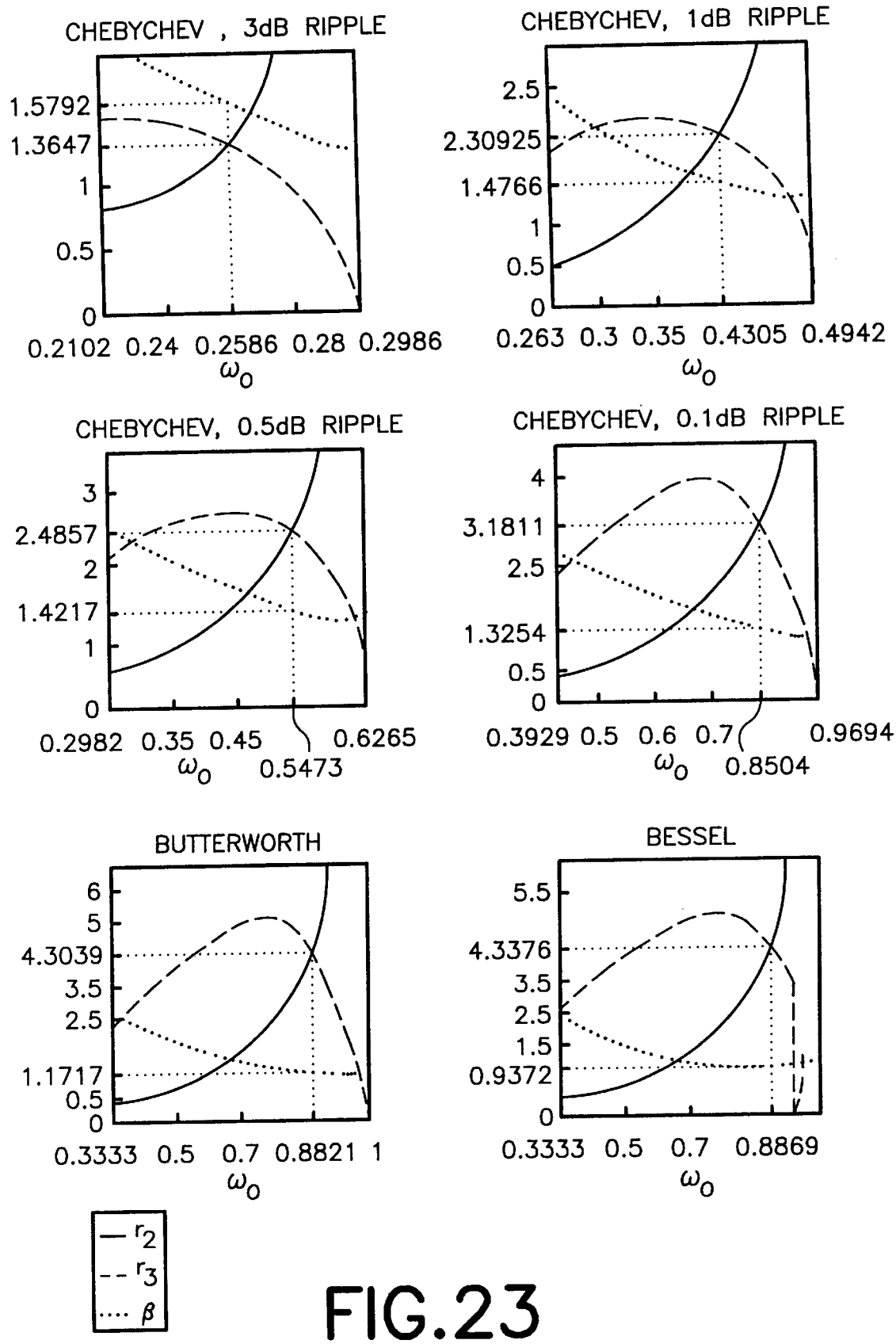
FIG. 23 illustrates the graphical method for finding $\omega_0$ for the case of $r_2 \approx r_3$.

Impedance Tapering of the Capacitors with $r_2 \approx r_3 = r$ will now be discussed. As shown above, the design equations 129–134 can be used to design a low-sensitivity filter by selecting the design parameters $\omega_0$, $\rho_2$ and $\rho_3$ and then computing the remaining design parameters $r_2$, $r_3$ and $\beta$. The value for $\omega_0$ can be selected in the manner discussed above, or, alternatively, it can be obtained using the appropriate graph in FIG. 23 for the case where $r_2$ is approximately equal to $r_3$. This is done explicitly with the six-step design procedure outlined above. If now $r_2 = r_3$ is selected, and tapering values for $\rho_2$ and $\rho_3$ are selected, equations 129–134 can be used to compute $\omega_0$, $r$ and $\beta$. However, because the resulting polynomial equations in $\omega_0$ or $r$ are of sixth-order, and therefore are not directly solvable, these equations cannot be solved in the straight forward manner discussed above. Instead, the bounds on $\omega_0$ can be computed and then the equations can be iteratively solved to obtain, more or less, $r_2 \approx r_3 = r$. "More or less" is quite sufficient here, since there is no well defined optimum for which the component sensitivities are minimum. The resulting design procedure is summarized in the following design steps. As in one of the previous illustrative examples, the specifications for the third-order Chebyshev filter shown in FIG. 15 shall be used. The corresponding filter coefficients are given by equation 141.

D. ITERATIVE COMPUTATION OF $r$, $r_2$ AND $r_3$

1. Calculate $\omega_{0\ max}$
   From equations 137 and 141, the following is obtained:

$$\omega_{0\ max} = 4 a_0 / 4 a_1 - a_2^2 = 2.9491 \times 10^5 \text{ rad/sec}$$

2. Select $\rho_2$, $\rho_3$, and calculate $\omega_{0\ max}$
   As in the previous examples, $\rho_2 = 3$ and $\rho_3 = 9$ are selected. With $r_2 = r_3 = r$, the following is obtained using equation 123:

$$\omega_0 = \left( a_0 \frac{r^2}{\rho_2 \rho_3} \right)^{1/3} \quad \text{(Eq. 163)}$$

In order to guarantee a minimum of resistive tapering, $r > 1$ is required. The lower bound on $\omega_0$, i.e., $\omega_{0\ min}$, is then obtained for $r = 1$:

$$\omega_{0\ min} = \left( \frac{a_0}{\rho_2 \rho_3} \right)^{1/3} \quad \text{(Eq. 164)}$$

Thus, from equation 141:

$$\omega_{0\ min} = \left( \frac{0.749 \cdot 10^{17}}{27} \right)^{1/3} = 1.405 \cdot 10^5 \text{ rad/sec} \quad \text{(Eq. 165)}$$

3. Select $\omega_0$ between $\omega_{0\ min}$ and $\omega_{0\ max}$ and calculate $r_2$ and $r_3$.
4. Repeat step 3 with new $\omega_0$ until $r_2 \approx r_3 = r$ is found.
   The value of $\omega_0 = 2.6 \times 10^5$ rad/sec was found using these two steps, for which $$r_2 = 2.594$$

and $$r_3 = 2.44$$

The results of this design are listed in the table of FIG. 29 under (8). It was shown in FIG. 22 that this design yielded the best results, i.e., the lowest sensitivity to component values.

5. Select $C_1$ and calculate $R_1$, $R_2$, $R_3$, $C_2$, $C_3$.
   Selecting $C_1 = 900$ pF the following is obtained:

$$R_1 = 1/\omega C_1 = 4.27 \text{ k}\Omega$$

$R_2 = r_2 R_1 = 11.07\ k\Omega$ $R_3 = r_3 R_1 = 10.42\ k\Omega$ $C_2 = C_1/\rho_2 = 300\ \rho F$ $C_3 = C_1/\rho_3 = 100\ \rho F$ (Eq. 166)

6.: Calculate $\beta$:

$$\beta = 1 + \frac{\rho_2}{\rho_3} - \frac{r_3}{\rho_3}\left[\alpha_2 - 1 - \frac{(1+\rho_2)}{r_2}\right] = 1 \cdot 41 \quad \text{(Eq. 167)}$$

Note that for the component calculations, the actual $r_2$ and $r_3$ values obtained in step 4 must be used. The fact that they are close to each other is important and determines the value $\omega_0$ used in the final circuit design.

As stated above, impedance tapered second and/or third order filters which have been impedance tapered in accordance with the method of the present invention can be cascaded to obtain impedance tapered higher order filters. It will be apparent to those skilled in the art how this can be accomplished since cascading lower order filters to obtain higher order filters is generally known in the art of filter design. Therefore, in the interest of brevity, a discussion of this procedure will not be provided.

Figure 30:
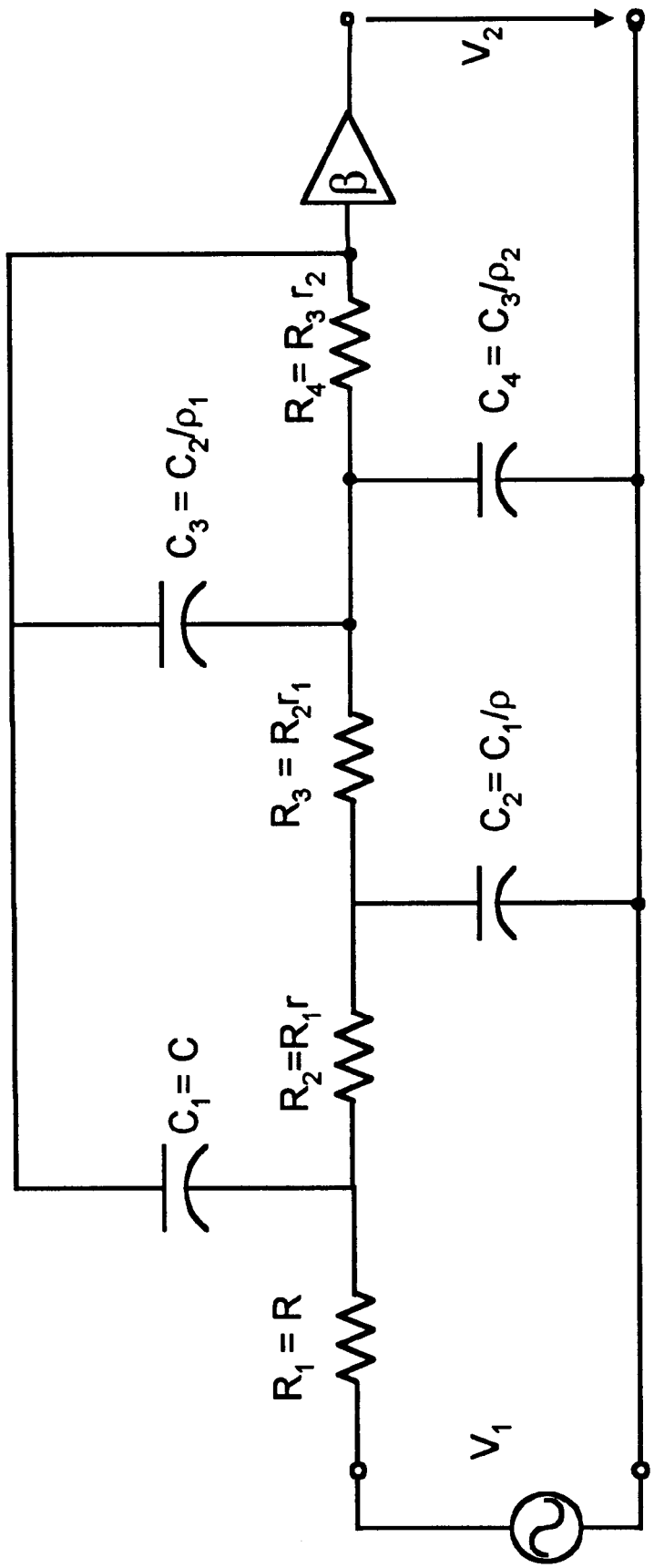
FIG. 30 illustrates a fourth order filter having a configuration similar to the third order filter of FIG. 13 and the nth order filter of FIG. 7.

Reference is now made to FIG. 30, which illustrates a fourth order filter, consistent with the nth order filter design illustrated in FIG. 7. More specifically, FIG. 30 shows a cascaded filter with low sensitivity to component values and gain. As shown, the filter includes a first resistor-capacitor section comprising a first resistor R1 having a first terminal and a second terminal and a first capacitor C1 having a first terminal and a second terminal. The first terminal of the first capacitor C1 is electrically coupled to said second terminal of said first resistor R1. The filter also includes a second resistor-capacitor section electrically coupled to said first resistor capacitor section, wherein the second resistor-capacitor section includes a second resistor R2 having a first terminal and a second terminal and a second capacitor C2 having a first terminal and a second terminal. The first terminal of the second capacitor C2 is electrically coupled to the second terminal of the second resistor R2. The filter also includes a third resistor-capacitor section electrically coupled to said second resistor-capacitor section, wherein the third resistor-capacitor section comprising a third resistor R3 having a first terminal and a second terminal and a third capacitor C3 having a first terminal and a second terminal. The first terminal of the third capacitor C3 is electrically coupled to the second terminal of the third resistor R3. Finally, the filter includes a fourth resistor-capacitor section electrically coupled to said third resistor-capacitor section. The fourth resistor-capacitor section includes a fourth resistor R4 having a first terminal and a second terminal and a fourth capacitor C4 having a first terminal and a second terminal. The first terminal of the fourth capacitor C4 is electrically coupled to said first terminal of the fourth resistor R4, wherein the value $C_2 = C_1 \div \rho$, wherein $\rho$ is greater than 1, and wherein $C_4 = C_3 \div \rho_2$, wherein $\rho_2$ is greater than 1. In the illustrated embodiment, $R_2 = (R_1 \times r)$, wherein r is greater than 1 and wherein $R_4 = (R_3 \times r_2)$, wherein $r_2$ is greater than 1. Further, $R_3 = (R_2 \times r_1)$, wherein $r_1$ is greater than 1. In addition, $C_3 = (C_2 \div \rho_1)$, wherein $\rho_1$ is greater than 1, and $C_4 = C_3 \div \rho_2$, wherein $\rho_2$ is greater than 1.

It should be noted that the present invention has been described with respect to the preferred embodiments but that the present invention is in no way limited to these embodiments. It will also be apparent to those skilled in the art that the concepts and methods of the present invention apply generally to the art of filter design and are not limited to the embodiments discussed. It will also be apparent to those skilled in the art that modifications to the methods discussed above can be made which are within the spirit and scope of the present invention.

What is claimed is:

1. A cascaded filter with low sensitivity to component values and gain, said filter comprising:

a first resistor-capacitor section comprising a first resistor having a first terminal and a second terminal and a first capacitor having a first terminal and a second terminal, said first resistor having a value $R_1$, said first capacitor having a value $C_1$, wherein the first terminal of said first capacitor is electrically coupled to said second terminal of said first resistor;

a second resistor-capacitor section electrically coupled to said first resistor capacitor section, said second resistor-capacitor section comprising a second resistor having a first terminal and a second terminal and a second capacitor having a first terminal and a second terminal, said second resistor having a value $R_2$, said second capacitor having a value $C_2$, wherein the first terminal of said second capacitor is electrically coupled to said second terminal of said second resistor;

a third resistor-capacitor section electrically coupled to said second resistor-capacitor section, said third resistor-capacitor section comprising a third resistor having a first terminal and a second terminal and a third capacitor having a first terminal and a second terminal, said third resistor having a value $R_3$, where $R_3 = (R_2 \times r_1)$, where $r_1$ is greater than 1, said third capacitor having a value $C_3$ wherein the first terminal of said third capacitor is electrically coupled to the second terminal of said third resistor; and a fourth resistor-capacitor section electrically coupled to said third resistor-capacitor section, said fourth resistor-capacitor section comprising a fourth resistor having a first terminal and a second terminal and a fourth capacitor comprising a first terminal and a second terminal, said fourth resistor having a value $R_4$, said fourth capacitor having a value $C_4$, wherein the first terminal of said fourth capacitor is electrically coupled to said first terminal of said fourth resistor, wherein the value $C_2 = C_1 \rho$, wherein $\rho$ is greater than 1, and wherein $C_4 = C_3/\rho_2$, wherein $\rho_2$ is greater than 1.

2. The filter of claim 1 wherein $R_2 = (R_1 \times r)$, wherein r is greater than 1 and wherein $R_4 = (R_3 \times r_2)$ wherein $r_2$ is greater than 1.

3. The filter of claim 1 wherein $C_3 = (C_2 \div \rho_1)$, wherein $\rho_1$ is greater than 1.

4. A cascaded filter with low sensitivity to component values and gain, said filter comprising:

a first resistor-capacitor section comprising a first resistor having a first terminal and a second terminal and a first capacitor having a first terminal and a second terminal, said first resistor having a value $R_1$, said first capacitor having a value $C_1$, wherein the first terminal of said first capacitor is electrically coupled to said second terminal of said first resistor;

a second resistor-capacitor section electrically coupled to said first resistor capacitor section, said second resistor-capacitor section comprising a second resistor having a first terminal and a second terminal and a second capacitor having a first terminal and a second terminal, said second resistor having a value $R_2$, said second capacitor having a value $C_2$, wherein the first terminal of said second capacitor is electrically coupled to said second terminal of said second resistor;

a third resistor-capacitor section electrically coupled to said second resistor-capacitor section, said third resistor-capacitor section comprising a third resistor having a first terminal and a second terminal and a third capacitor having a first terminal and a second terminal, said third resistor having a value $R_3$, where $R_3=R_2 \times r_1$ and where $r_1$ is greater than 1, said third capacitor having a value $C_3$, wherein the first terminal of said third capacitor is electrically coupled to the second terminal of said third resistor; and a fourth resistor-capacitor section electrically coupled to said third resistor-capacitor section, said fourth resistor-capacitor section comprising a fourth resistor having a first terminal and a second terminal and a fourth capacitor comprising a first terminal and a second terminal, said fourth resistor having a value $R_4$, said fourth capacitor having a value $C_4$, wherein the first terminal of said fourth capacitor is electrically coupled to said first terminal of said fourth resistor, wherein $R_2=R_1 \times r$, wherein r is greater than 1, and wherein $R_4=R_3 \times r_2$ wherein $r_2$ is greater than 1.

5. The filter of claim 4 wherein $C_2=C_1 \div \rho$, wherein $\rho 0$ is greater thin 1.

6. The filter of claim 5 wherein $C_3=C_2 \div \rho_1$, wherein $\rho_1$ is greater than 1.

7. The filter of claim 7 wherein $C_4=C_3 \div \rho_2$, wherein $\rho_2$ is greater than 1.

8. A method of designing a cascaded filter with low sensitivity to component values comprising the steps of:

designing a first filter circuit having a first filter section and a second filter section, said first filter section comprising a first resistor having a value R and a first capacitor having a value C, said second filter section comprising a second resistor having a value $R_2$ and a second capacitor having a value $C_2$ wherein said second filter section has a higher impedance than said first filter section;

designing a second filter circuit having a first filter section and a second filter section, said first filter section of said second filter circuit comprising a third resistor having a value $R_3$, where $R_3=R_2 \times r_1$, and where $r_1$ is greater than 1, and a third capacitor having a value $C_3$, said second filter section of said second filter circuit comprising a fourth resistor having a value $R_4$, and a fourth capacitor having a value $C_4$, wherein said second filter section of said second filter circuit has a higher impedance than said first filter section of said second filter circuit; and cascading said first and second filter circuits.

9. The method of claim 8 wherein $r_1$ is less than or equal to 10.

10. The method of claim 8 wherein $R_2=R \times r$, wherein r is greater than 1.

11. The method of claim 10 wherein r is less than or equal to 10.

12. The method of claim 8 wherein $R_4=R_3 \times r_2$, wherein $r_2$ is greater than 1.

13. The method of claim 12 wherein $r_2$ is less than or equal to 10.

14. The method of claim 8 wherein $C_2=C \div \rho$, wherein $\rho$ is greater than 1.

15. The method of claim 14 wherein $\rho$ is less than or equal to 10.

16. The method of claim 14 wherein $C_3=C_2 \div \rho_1$, wherein $\rho_1$ is greater than 1.

17. The method of claim 16 wherein $\rho_1$ is greater than or equal to 10.

18. The method of claim 16 wherein $C_4=C_3 \div \rho_2$, wherein $\rho_2$ is greater than 1.

19. The method of claim 18 wherein $\rho_2$ is greater than or equal to 10.

* * * * *